United States Patent
Suzuki et al.

(10) Patent No.: US 6,208,204 B1
(45) Date of Patent: Mar. 27, 2001

(54) FEEDFORWARD AMPLIFIER

(75) Inventors: Yasunori Suzuki, Yokohama; Toshio Nojima; Shoichi Narahashi, both of Yokosuka, all of (JP)

(73) Assignee: NTT Mobile Communications Network, Inc., Tokyo (JP)

( * ) Notice: Subject to any disclaimer, the term of this patent is extended or adjusted under 35 U.S.C. 154(b) by 0 days.

(21) Appl. No.: 09/460,707

(22) Filed: Dec. 14, 1999

(30) Foreign Application Priority Data

Dec. 14, 1998 (JP) .................................. 10-354942
Dec. 14, 1998 (JP) .................................. 10-354944
Jan. 18, 1999 (JP) .................................. 11-009348
Jan. 18, 1999 (JP) .................................. 11-009349

(51) Int. Cl.[7] .............................. H03F 3/66; H03F 1/26; H03F 1/00
(52) U.S. Cl. ........................... 330/52; 330/149; 330/151
(58) Field of Search ............................. 330/52, 149, 151

(56) References Cited

U.S. PATENT DOCUMENTS 5,745,839 * 4/1998 Lieberman .............................. 455/10
6,049,535 * 4/2000 Ozukturk et al. ...................... 455/69
6,133,791 * 10/2000 Horiguchi et al. ..................... 330/151

* cited by examiner

Primary Examiner—Robert Pascal
Assistant Examiner—Patricia T. Nguyen
(74) Attorney, Agent, or Firm—Connolly Bove Lodge & Hutz

(57) ABSTRACT

In the balance adjustment using a pilot signal in a distortion detector and a distortion canceller of a feed-forward amplifier for amplifying a CDMA transmission signal, a pilot code is spread by a long code different from that of the CDMA transmission signal to obtain the pilot signal. The pilot signal is converted to a signal of the transmission frequency band, and the converted signal is injected into the transmission signal at the input side of the amplifier. The pilot signal frequency band is detected from the output of an auxiliary amplifier of the distortion canceller and converted to the base band, thereafter being despread to detect the pilot signal (code).

17 Claims, 27 Drawing Sheets

FEEDFORWARD AMPLIFIER

BACKGROUND OF THE INVENTION

The present invention relates to a feed-forward amplifier for use mainly in the high-frequency band and, more particularly, to a feed-forward amplifier which has a distortion detector for detecting a nonlinear distortion component generated by a main amplifier and a distortion canceller which amplifies the detected distortion component by an auxiliary amplifier and injects it again to the output of the main amplifier, thereby canceling the distortion component.

In FIG. 1 there is depicted the basic configuration of a feed-forward amplifier. The feed-forward amplifier comprises two signal cancellers for compensating for distortions that the main amplifier produces. One of the signal cancellers is a distortion detector 11 and the other a distortion canceller 12. The distortion detector 11 is made up of an input path 8, a main amplifier signal path 13, and a linear signal path 14. The distortion canceller 12 is made of up a main signal path 15, a distortion injection path 16, and an output path 9. The main amplifier signal path 13 is formed by a cascade connection of a variable attenuator 17, a variable phase shifter 18 and a main 20 amplifier 19, whereas the linear signal path 14 is formed by a delay line 28 and a phase inverter 29. In the main signal path 15 there is connected a delay line 21, whereas in the distortion injection path 16 there are connected in cascade a variable attenuator 22, a variable phase shifter 23 and an auxiliary amplifier 24. Reference numerals 25, 26 and 27 denote a power 25 divider, a power combiner/divider 26 and a power combiner, which are simple no-loss power divider and simple power combiners each formed by a transformer circuit, a hybrid circuit or the like.

A description will be given first of the basic operation of the feed-forward amplifier. An input signal to the feed-forward amplifier is divided by the power divider 25 to two signals for input the main amplifier signal path 13 and the linear signal path 14. In this case, the variable attenuator 17 and the variable phase shifter 18 in the main amplifier signal path 13 are adjusted so that the signals on the main amplifier signal path 13 and the linear signal path 14 are equal in amplitude but opposite in phase to each other. The "opposite phase" condition is met by setting an appropriate amount of phase shift between the input and output terminals of the power divider 25 or power combiner/divider 26, or through utilization of a phase inversion in the main amplifier 19. The distortion detector 11 of such a construction detects a difference component between the main amplifier signal path 13 and the linear signal path 14. It is this difference component that is the distortion component the main amplifier 19 generates. On account of this, the above circuit arrangement is commonly referred to as a distortion detector.

The output from the distortion detector 11 is divided by a power/combiner divider 26 to two outputs that are provided to the main signal path 15 and the distortion injection path 16. The input to the main signal path 15 is the sum of the output from the main amplifier signal path 13 and the output from the linear signal path 14. The input to the distortion injection path 16 is the difference between the output from the main amplifier signal path 13 and the output from the linear signal path 14. The variable attenuator 22 and the variable phase shifter 23 in the distortion injection path 16 are adjusted so that the signals on the main signal path 15 and the distortion injection path 15 are equal in amplitude but opposite in phase at the output end of the distortion canceller 12. As the result of this, the distortion components by the main amplifier 19 are injected into the distortion canceller 12 in the opposite-phase but equal-amplitude relation, and hence they can be cancelled.

The above is an ideal distortion compensating operation of the feed-forward amplifier. In practice, however, it is not easy to maintain perfect balance in the respective circuits of the distortion detector 11 and the distortion canceller 12. And even if their initialization is perfect, amplifier characteristics vary with ambient temperature, the power supply and so forth; hence, it is extremely difficult to provide stable and excellent balance over a long period of time.

To maintain the balance of the distortion detector 11 and the distortion canceller 12 of the feed-forward amplifier, there has been proposed an automatic adjustment method using a pilot signal, for example, in Japanese Patent Application Laid-Open Gazette No. 1-198809 entitled "Automatic Adjuster for Feed-forward Amplifier." A device based on such a scheme is described in "Extremely Low-Distortion Multi-Carrier Amplifier for Mobile Communication System—Self-Adjusting Feed-forward Amplifier (SAFF-A)" The Institute of Electronics, Information and Communication Engineers of Japan, Technical Report, RCS90-4, 1990.

In FIG. 2 there is shown in block form an example of the configuration of the feed-forward amplifier using the pilot signals. As depicted, the feed-forward amplifier is provided with: a first pilot injector 32 connected to the input path 8 of the distortion detector 11 to multiplex a first pilot signal $PL_1$ from a first pilot signal generator 31 onto a transmission signal; a first pilot signal extractor 33 connected between the power combiner/divider 26 and the variable attenuator 22 to extract the pilot signal $PL_1$; a second pilot injector 35 connected between stages of the main amplifier 19 to inject a second pilot signal $PL_2$ from a second pilot signal generator 34 into the transmission signal; and a second pilot signal extractor 36 connected to the output path 9 of the distortion canceller 12 to detect the second pilot signal $PL_2$. The levels of the first and second pilot signals $PL_1$ and $PL_2$ extracted by the first and second pilot signal extractors 33 and 36 are detected by first and second pilot level detectors 37 and 38, respectively, and the level detected outputs are provided to a controller 39. The controller 39 controls the variable attenuators 17 and 22 and the variable phase shifters 18 and 23. That is, the first and second pilot signals $PL_1$ and $PL_2$ are used to detect the balance of the distortion detector 11 and the distortion canceller 12; and the detected balance is appropriately adjusted using the first variable attenuator 17 and the first phase shifter 18 inserted in the main amplifier signal path 13 and the second variable attenuator 22 and the second variable phase shifter 23 inserted in the distortion injection path 16 of the distortion canceller 12. By this, the distortions produced by the main amplifier 19 are compensated for. To achieve the balance of the circuits 11 and 12, the variable attenuators 17 and 22 and the variable phase shifters 18 and 23 are electrically controlled on a stepwise basis to minimize the levels of the pilot signals, for example, by such a simple control algorithm as the perturbation method or steepest descent method or by an adaptive control algorithm based on the least square estimation method. Such automatic control can easily be implemented by a microcomputer.

To process pilot signals in such an automatic adjustment circuit, there has been proposed a simple method using single-frequency pilot signals (for instance, Japanese Pat. Appln. No. 3-49688 entitled "Feed-forward Amplifier"). This method permits simplification of the circuit configuration but involves the necessity for raising the level of the pilot signal to enhance the sensitivity of its detection because the optimum operating point in this method is set at a point of the lowest level of the pilot signal detection. In this instance, if an interference signal such as leakage power of other devices or noise gets mixed into the pilot signal detection band in the feed-forward amplifier, an error arises in the detection level and prevents the feed-forward amplifier from achieving a high precision control operation and the optimum operation.

To implement a feed-forward interference circuit that permits a high precision pilot detection insusceptible to the interference by various kinds of noise, there have been proposed a scheme using a pilot signal modulated at a low frequency (Japanese Patent Application Laid-Open No. 5-9084 entitled "Feed-forward Interference Circuit") and a scheme using a pilot signal obtained by modulating a low-frequency signal through the frequency spread spectrum technique (Japanese Patent Application Laid-Open No. 4-364602 entitled "Feed-forward Interference Circuit"). These schemes are described in U.S. Pat. No. 5,166,634.

The automatic adjustment method of the feed-forward amplifier that uses such pilot signals enables separation of the bands of the pilot signal and the transmission signal; hence it is effective in transmitting amplifiers of FDMA (Frequency Division Multiple Access) and TDMA (Time Division Multiple Access) radio communication systems.

On the other hand, it is impossible, for the reasons given below, to use the conventional pilot signal intact in the transmitting amplifier for the CDMA (Code Division Multiple Access) radio communication system. First, since the CDMA carrier frequency band is wider than in the traditional TDMA and FDMA radio communication systems, the assignment of one frequency to the pilot signal will seriously reduce the cost efficiency of the radio communication system. Secondly, if the pilot signal is inserted in the transmitting frequency band, it is difficult to make the level of the pilot signal sufficiently lower than the level of the transmission signal and provide a sufficiently high degree of accuracy in the detection by the level detector. The reason for this is that the CDMA transmission signal suppresses the sensitivity to the pilot signal. Thirdly, even if the second problem is solved, the pilot signal interferes with the transmission signal because the pilot signal is not orthogonal to the transmission signal whose output is controlled at all times.

For the reasons given above, the pilot signal generating and detecting schemes for the automatic adjustment of the conventional feed-forward amplifiers are lacking in the practical applicability to the low-distortion transmitting amplifier for the CDMA radio communication system.

SUMMARY OF THE INVENTION

It is therefore an object of the present invention to provide a feed-forward amplifier for CDMA transmission signals that is easy of automatic adjustment.

According to the present invention, the first pilot code of a particular bit pattern conventionally used as a first pilot signal is spectrum-spread by a spreading code in the CDMA radio communication system. The spectrum-spread first pilot signal is frequency converted by a frequency converter to a signal of a first specified frequency band. The frequency-converted signal is multiplexed by a first pilot multiplexer onto the transmission signal. The thus multiplexed first pilot signal is extracted by a first pilot signal extractor and is then frequency converted by a frequency converter to a base band signal. The thus frequency-converted first pilot signal is despread by the spreading code used for the above spectrum spreading, by which the original first pilot code is detected.

DETAILED DESCRIPTION OF THE PREFERRED EMBODIMENTS

First Embodiment

Figure 1:
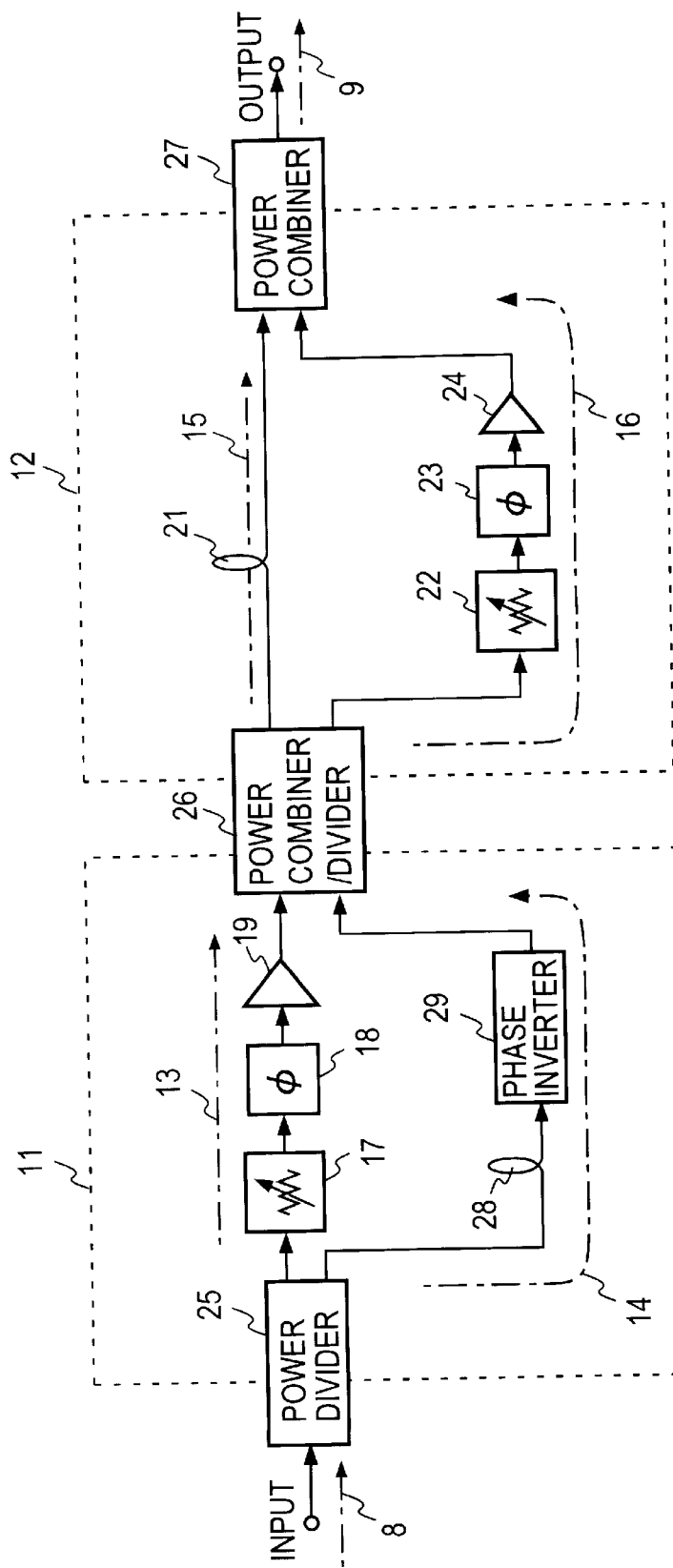
FIG. 1 is a block diagram depicting the general configuration of a conventional feed-forward amplifier.
Figure 2:
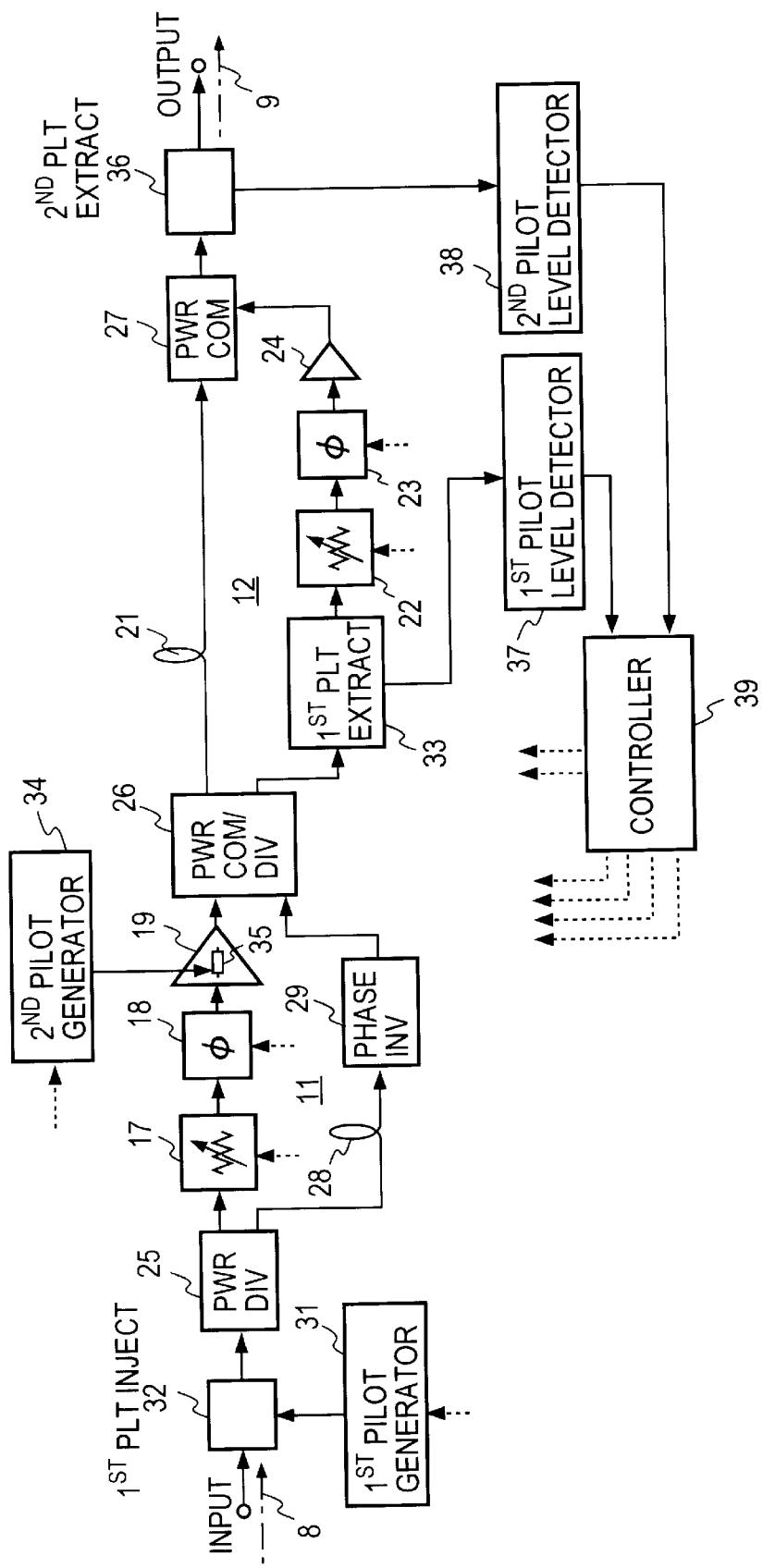
FIG. 2 is a block diagram depicting a circuit arrangement for balance control that uses pilot signals in the conventional feed-forward amplifier.
Figure 3:
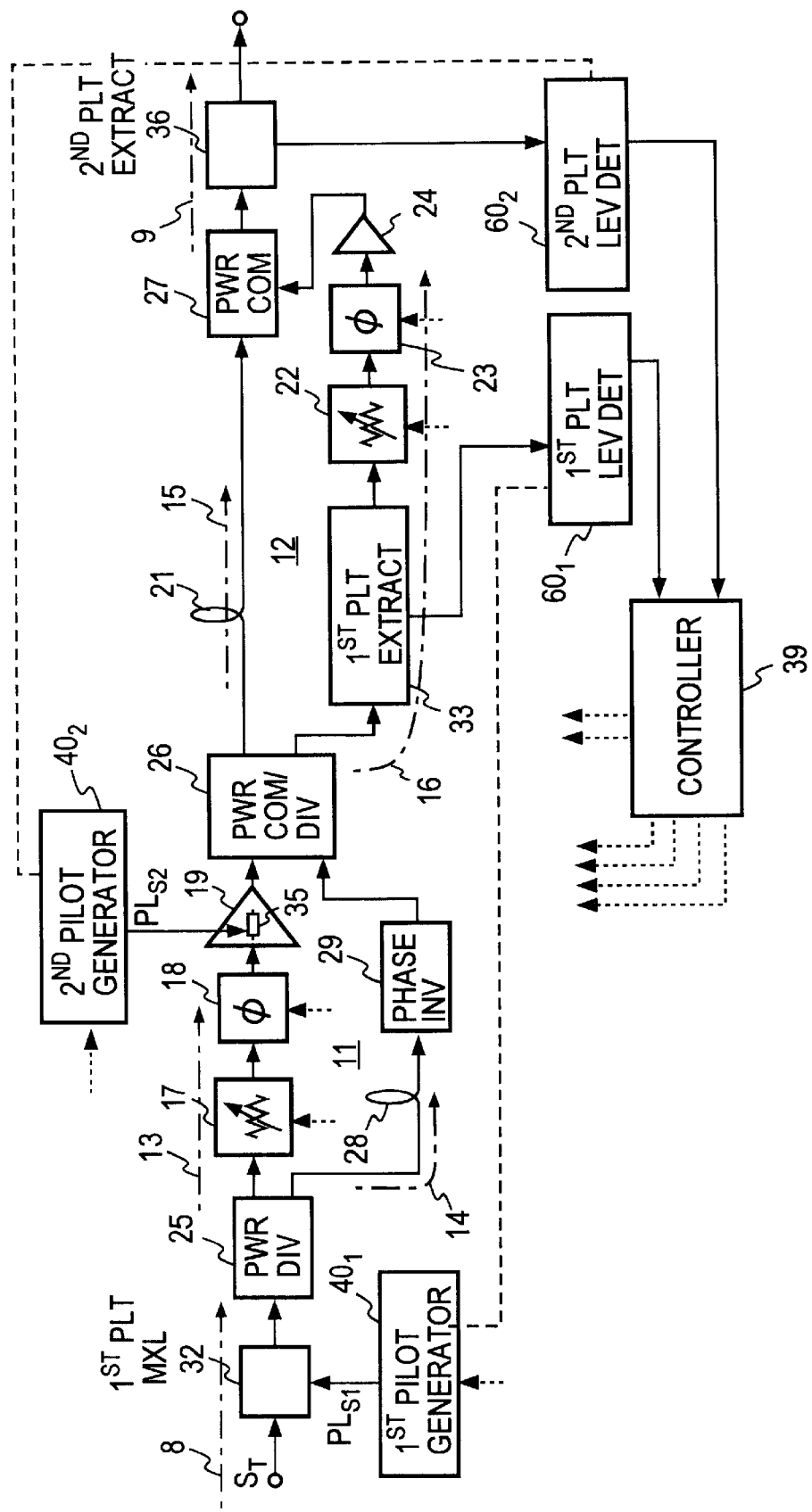
FIG. 3 is a block diagram illustrating the configuration of a first embodiment of the feed-forward amplifier according to the present invention.

In FIG. 3 there is illustrated in block form a first embodiment of the feed-forward amplifier according to the present invention. This embodiment is basically identical in configuration with the conventional feed-forward amplifier of FIG. 2 but differs therefrom in that the input signal is a CDMA transmission signal and that first and second pilot signal generators $40_1$, $40_2$ and first and second pilot level detectors $60_1$, $60_2$, which are substitutes for the first and second pilot signal generators 31, 34 and the first and second pilot level detectors 37, 38 in the prior art example of FIG. 2, are novel as described below in detail. Accordingly, the parts corresponding to those in FIG. 2 are identified by the same reference numerals and no description will be repeated thereon.

Figure 4:
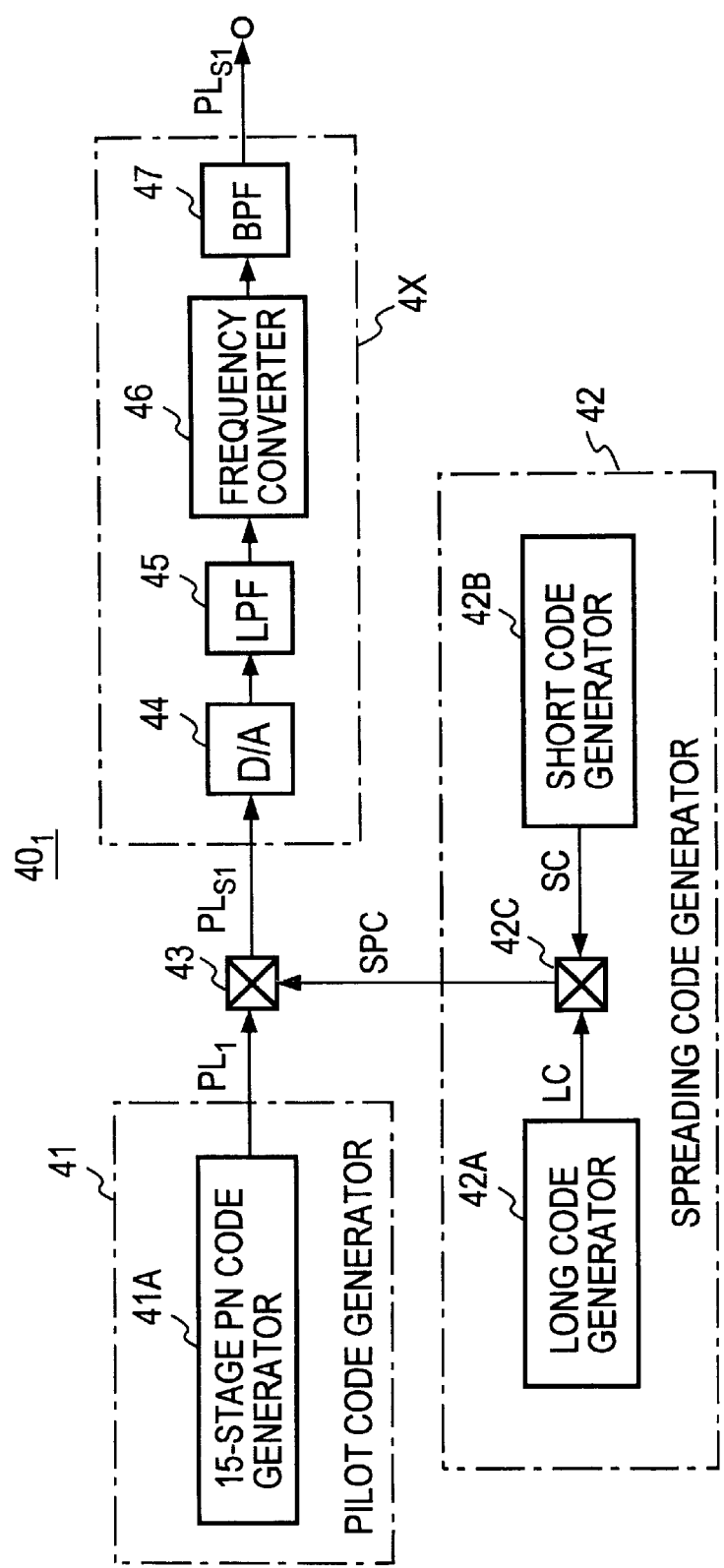
FIG. 4 is a block diagram illustrating an example of a pilot signal generator for use in the present invention.

The first and second pilot signal generators $40_1$ and $40_2$ can be made identical in construction. In FIG. 4 there is depicted only the first pilot signal generator $40_1$. The first pilot signal generator $40_1$ is made up of a pilot code generator 41, a spreading code generator 42, a digital multiplier 43, a digital-to-analog (DA) converter 44, a low-pass filter 45, a frequency converter 46 and a band-pass filter 47.

The pilot code generator 41 uses a 15-stage PN code generator 41A that generates, for example, a specific bit pattern as a pilot signal. Since the pilot signal $PL_1$ is spread directly by a spreading code SPC, it can be chosen with a high degree of freedom. For example, a synchronization code of the transmission signal can be used as the pilot signal. Also it is possible to use a single-frequency digital signal like a tone signal.

The spreading code generator 42 generates a spreading code for use in the CDMS radio communication system. For instance, if a W-CDMA (Wideband CDMA) communication system is used, the spreading code generator 42 is formed, as shown in FIG. 4, by a long code generator 42A for generating a long code LC, a short code generator 42B for generating a short code SC, and a multiplier 42C for multiplying the long and short codes LC and SC to provide the spreading code SPC. The short code SC is an orthogonal code common to respective cells in each service area, and the long code LC is an orthogonal code different for each cell in the service area. Usually, the short code SC is a short-period orthogonal code and the long code a long-period orthogonal code.

To distinguish between first and second pilot signals $PL_{S1}$ and $PL_{S2}$, different spreading codes are used to spread them. For example, since the same spreading code is assigned as the short code SC to all the cells in each area, the first and second pilot signals $PL_{S1}$ and $PL_{S2}$ are distinguished mainly using different long codes LC.

Figure 6:
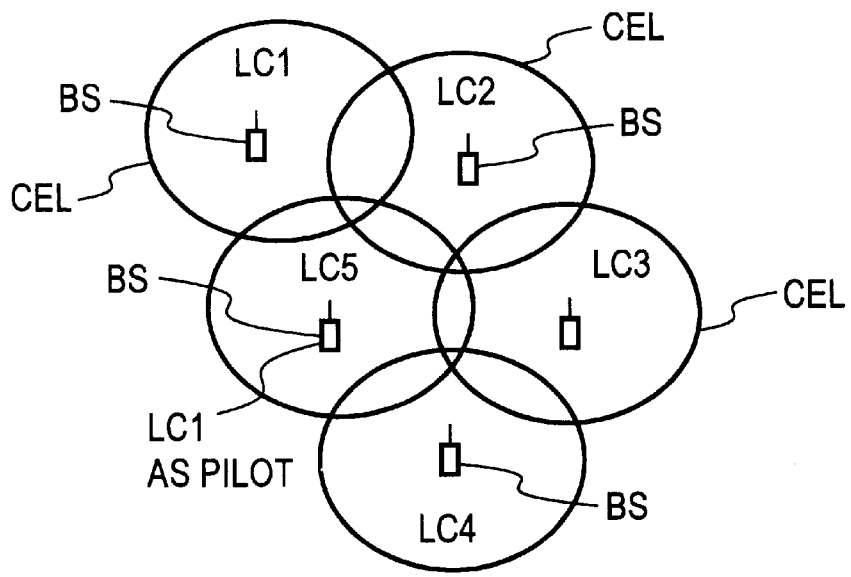
FIG. 6 is a diagram schematically showing, by way of example, the relationship between a long code assigned to the base station of each cell for the CDMA mobile communication and a long code for spreading a pilot code in the present invention.

FIG. 6 shows an example of the actual use of spreading codes in a concrete feed-forward amplifier in the case where a plurality of cells CEL are distinguished by long codes in one service area. The cells CEL each has a base station BS, to which a different long code is assigned; for example, one of long codes LC1 to LC5 is assigned to each base station BS. Assume that one of the base stations BS provided with the feed-forward amplifier according to the present invention is already assigned the long code LC5. In the feed-forward amplifier of the base station BS, the spreading code generator 42 uses, as a spreading code for the generation of the pilot signal, the long code, for instance, LC1 assigned to a different base station so as to prevent the pilot signal from interfering with the transmission signal. This can be done since the long codes are orthogonal to each other. Furthermore, since the level of the pilot signal is set at as small a value as −60 dB or less as compared with the level of the transmission signal, substantially no influence is exerted on the transmission signal even if the pilot signal is sent by radio waves from a base station antenna. Of course, the pilot signal of such a low level hardly affects the area using the long code LC1 since the base stations are sufficiently spaced apart.

Figure 7:
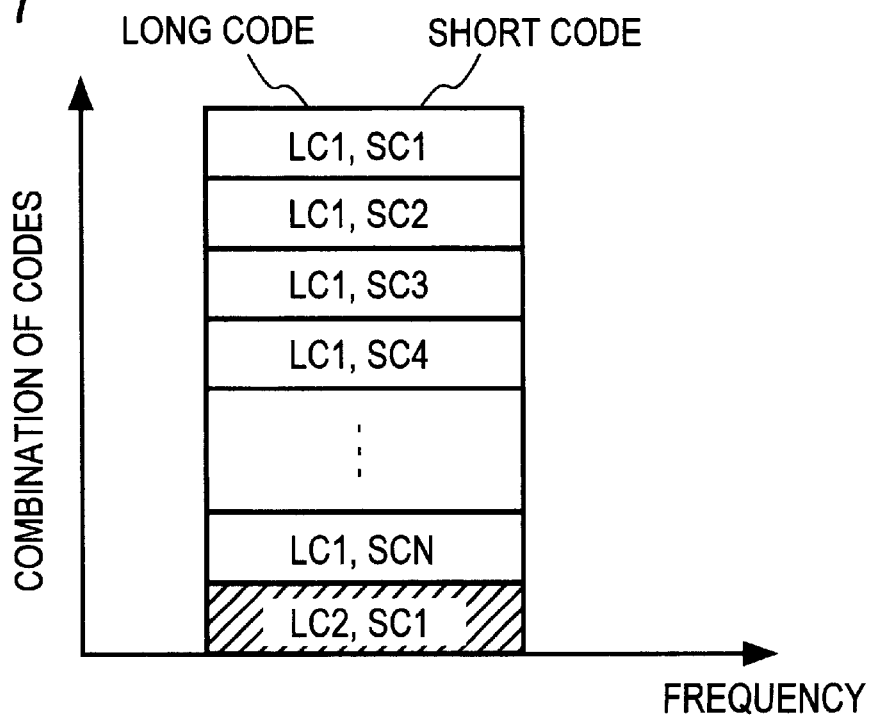
FIG. 7 is a diagram showing, by way of example, a combination of long and short codes and frequency bands.

FIG. 7 shows an example of a set of long and short codes for use in one base station. In this example, the common long code LC1 is used to spread the transmission signal in combination with the short codes SC1, SC2, . . . , SCN, and the long code LC2 is used to spread the pilot signal in combination with a short code, for instance, SC1. In this way, the pilot signal is superimposed onto the transmission signal unlike the conventional pilot signal. These spreading codes may also be identical spreading codes of different initial phases.

Turning back to FIG. 4, the pilot code $PL_1$ and the spreading code SPC are multiplied by the multiplier 43 to generate the pilot signal $PL_{S1}$. As a result, the pilot code $PL_1$ is spectrum-spread directly by the spreading code composed of the long and short codes. The pilot signal $PL_{S1}$ is converted by the DA converter 44 to an analog signal, which is then band-limited by the low-pass filter 45. The output from the low-pass filter 45 is frequency-converted by the frequency converter 46. The first pilot signal $PLS_1$ is frequency-converted to a signal of the transmission frequency band, whereas the second pilot signal $PLS_2$ is frequency-converted to a signal of other frequency band than the transmission frequency band. The signal components of the respective pilot signals in other frequency bands than predetermined ones are rejected by the band-pass filter 47, and the first and second pilot signals are provided from the first and second generator $40_1$ and $40_2$. For the sake of brevity in the following description, a block 4X will hereinafter be referred to as a signal conversion part which is formed by a series connection of the DA converter 44, the low-pass filter 45, the frequency converter 46 and the band-pass filter 47 for converting the base band digital signal to a signal of the transmission frequency band. The pilot signal $PL_{S1}$ is multiplexed by a pilot signal multiplexer 32 in FIG. 3 onto a transmission signal $S_T$ input thereto and fed into the input path 8. On the other hand, the second pilot signal $PL_{S2}$ is provided onto the main amplifier signal path 13 via an injector circuit 35 in the main amplifier 19. The pilot signal generators $40_1$ and $40_2$ of the configuration shown in FIG. 4 are applicable to all the embodiments described later on.

Figure 5:
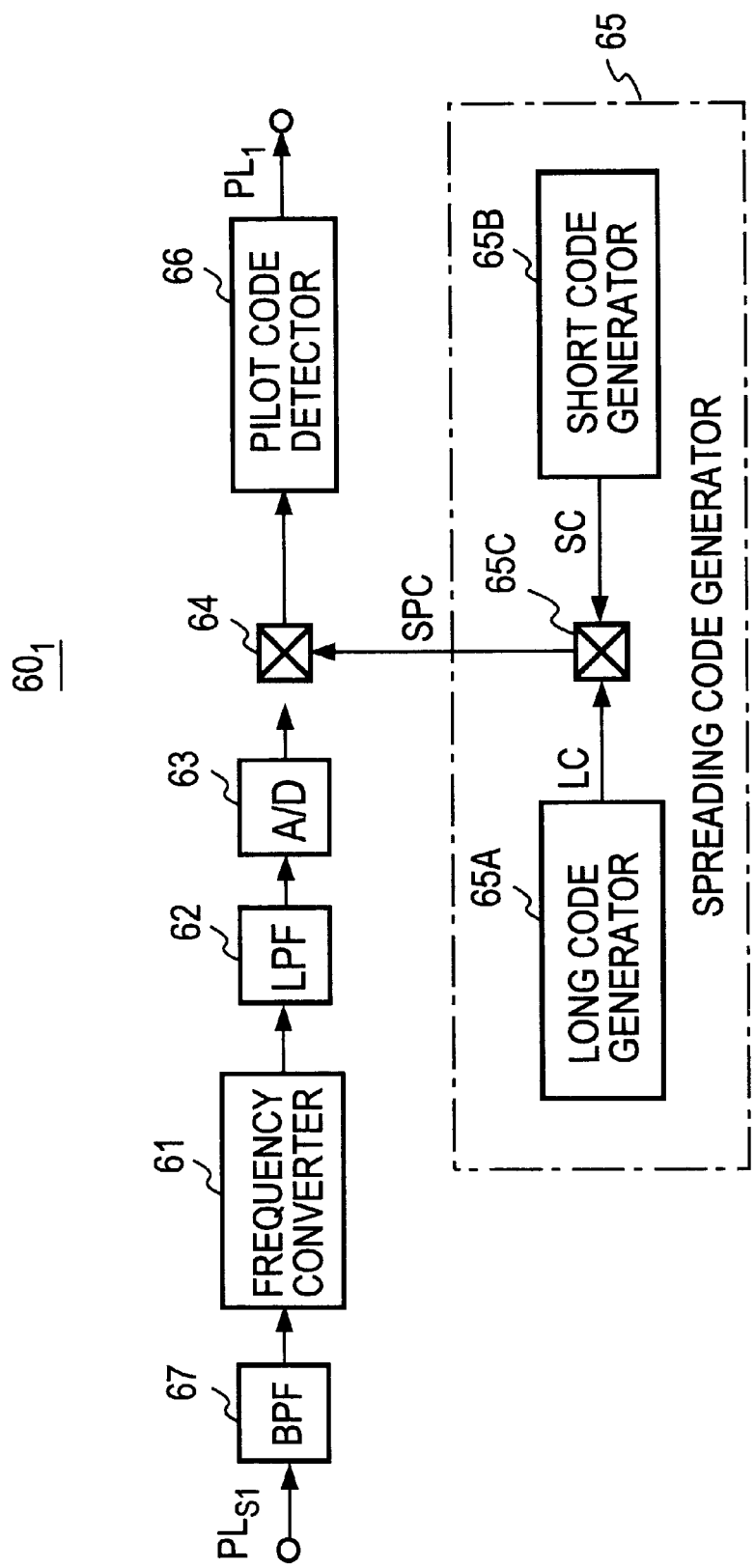
FIG. 5 is a block diagram depicting an example of a pilot level detector for use in the present invention.

FIG. 5 depicts in block form an example of a first pilot level detector $60_1$. A second pilot level detector $60_2$ is identical in construction with the first pilot level detector $60_1$, and hence it is not shown. The first pilot level detector $60_1$ comprises a band-pass filter 67, a frequency converter 61, a low-pass filter 52, an AD converter 63, a digital multiplier 64, a spreading code generator 65, and a pilot code detector 66. The blocks 67, 61, 62 and 63 constitute a signal conversion part 6X. The spreading code generator 65 is identical in construction with the spreading code generator 42 depicted in FIG. 4; that is, it is made up of a long code generator 65A, a short code generator 65B and a multiplier 65C, and generates the same spreading code SPC as is obtainable with the spreading code generator $40_1$. Accordingly, the feed-forward amplifier in actual use dispenses with the spreading code generators 65 of the first and second pilot level detectors $60_1$ and $60_2$, in which case the spreading codes generated by the spreading code generators 42 of the first and second pilot signal generators $40_1$ and $40_2$ (FIG. 4) are provided to the multipliers 64 of the first and second pilot level detectors $60_1$ and $60_1$, respectively, as indicated by the broken line in FIG. 3.

The output from each of the first and second pilot signal extractors 33 and 36 in FIG. 3 is applied to the band-pass filter 67, wherein its components of frequency bands other than predetermined ones are rejected, and the filter output is fed into the frequency converter 61. The frequency converter 61 frequency-converts the extracted pilot signal to a base band signal. The output from the frequency converter 61 is input into the low-pass filter 62, wherein it is band-restricted. The output from the low-pass filter 62 is converted by the AD converter 63 to a digital signal. The pilot signal thus converted to digital form is despread by being multiplied in the digital multiplier 64 by the spreading code SPC generated by the spreading code generator 65. The spreading code SPC needs to be the same as the spreading code used for each of the first and second pilot signals. The thus despread pilot code $PL_1$ is detected as a pilot code by the pilot code detector 66. The pilot code detector 66 may be formed using a narrow-band filter or such a conventional CDMA device as a correlation detector of some kind. The pilot level detectors $60_1$ and $60_2$ of the configuration depicted in FIG. 5 are also applicable to all of the embodiments described later on.

Figure 8A:
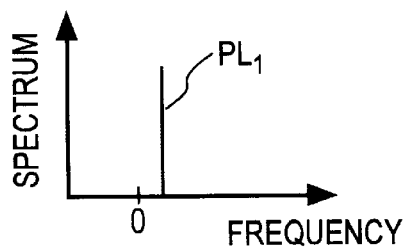
FIG. 8A is a diagram depicting the spectrum of a first pilot signal.
Figure 8B:
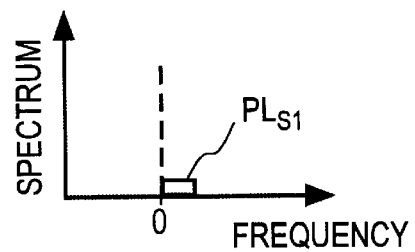
FIG. 8B is a conceptual diagram showing the spectrum of a spread pilot signal.
Figure 8C:
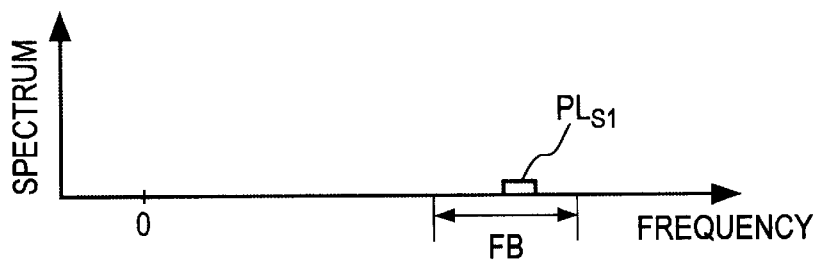
FIG. 8C is a conceptual diagram showing the spectra of a spread transmission signal and the spread first pilot signal.
Figure 8D:
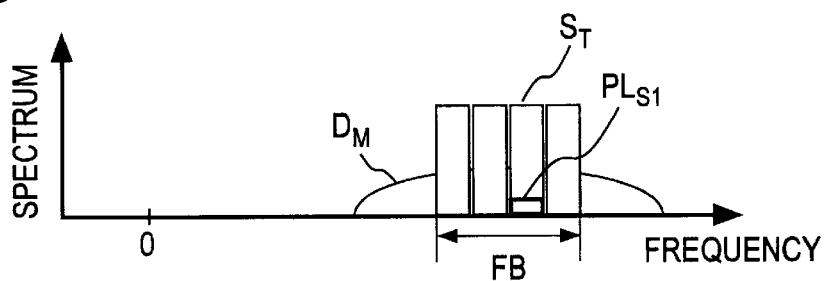
FIG. 8D is a conceptual diagram showing the spectra of a high-frequency transmission signal and an up-converted first pilot signal.
Figure 8E:
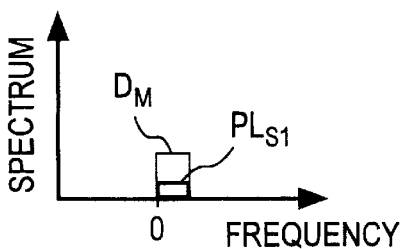
FIG. 8E is a conceptual diagram showing the spectra of the transmission signal and the first pilot signal put back to the base band in a pilot detector.
Figure 8F:
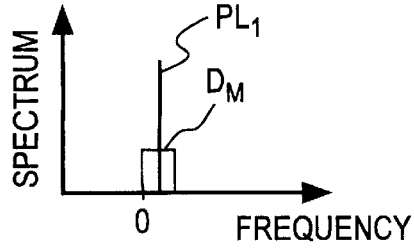
FIG. 8F is a conceptual diagram showing the spectra of the first pilot signal and the transmission signal obtained by dispreading.

FIGS. 8A through 8F show the spectra of the first pilot signal and the transmission signal at respective parts in FIGS. 4 and 5. Depicted in FIG. 8A is an example of the spectrum of the first pilot code $PL_1$ that is the output from the pilot code detector 41. In this example, the first pilot code has the spectrum of a single-frequency signal. FIG. 8B shows the spectrum of the pilot signal $PL_{S1}$ spread directly by the spreading code SPC. A frequency-converted version of the output from the low-pass filter 45 is shown in FIG. 8C. The spread first pilot signal $PL_{S1}$ is converted to a signal of the transmission frequency band FB. The first pilot signal and the transmission signal are power-amplified by the main amplifier 19. The output spectrum of the main amplifier 19 is depicted in FIG. 8D. In this example, a four-carrier amplification is assumed. As depicted in FIG. 8D, the first pilot signal $PL_{S1}$ is superimposed on the transmission signal $S_T$ of one carrier. The output from the low-pass filter 62 in FIG. 5 is shown in FIG. 8E. As depicted in FIG. 8E, the transmission signal, which has superimposed thereon the first pilot signal frequency-converted from the transmission frequency band to the base band is band-limited to extract the first pilot signal. Shown in FIG. 8F is the output despread by the spreading code after being converted to digital form. As depicted in FIG. 8F, the first pilot signal $PL_{S1}$ superimposed on the transmission signal can be extracted by digital signal processing.

Figure 9A:
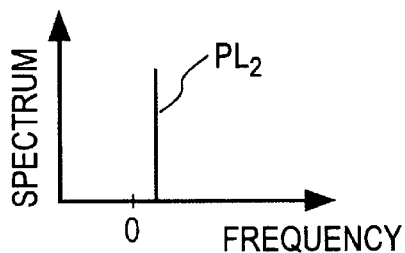
FIG. 9A is a diagram depicting the spectrum of a second pilot signal.
Figure 9B:
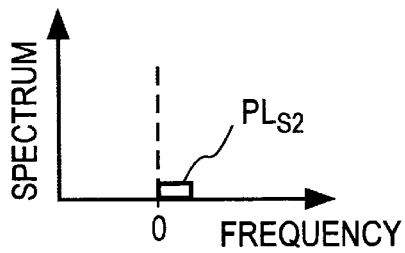
FIG. 9B is a conceptual diagram depicting the spectrum of a spread second pilot signal.
Figure 9C:
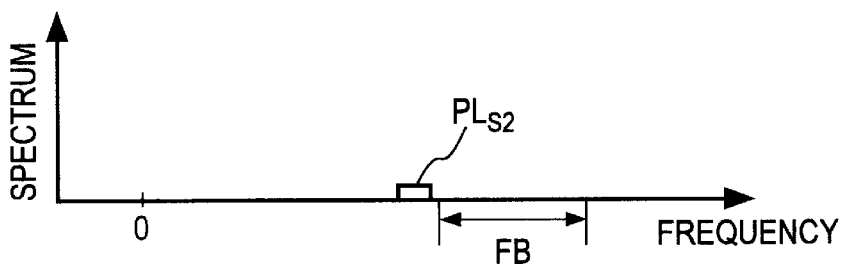
FIG. 9C is a conceptual diagram depicting the spectrum of an up-converted second pilot signal.
Figure 9D:
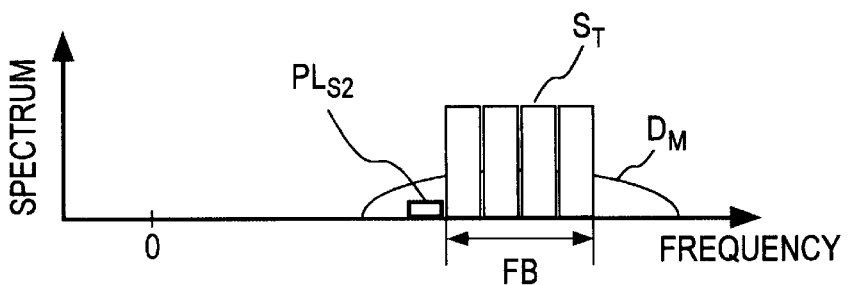
FIG. 9D is a conceptual diagram depicting the spectra of a high-frequency transmission signal and the up-converted second pilot signal.
Figure 9E:
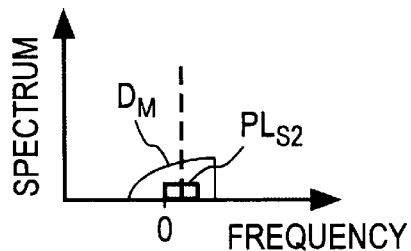
FIG. 9E is a conceptual diagram depicting the spectra of a distortion component and the second pilot signal put back to the base band in the pilot detector.
Figure 9F:
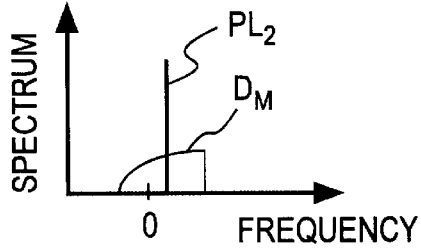
FIG. 9F is a conceptual diagram depicting the spectra of the pilot signal and the distortion component obtained by dispreading.

FIGS. 9A through 9F each show the spectrum of the second pilot signal at respective part in FIGS. 4 and 5. FIG. 9A depicts the spectrum of the second pilot code $PL_2$ generated by the pilot code generator 41 of the second pilot signal generator $40_2$. In this case, too, the second pilot has the spectrum of a single-frequency signal. FIG. 9B shows the spectrum of the second pilot signal $PL_{S2}$ obtained by directly spreading the second pilot code $PL_2$ with the spreading code. Shown in FIG. 9C is the spectrum of the second pilot signal $PLS_2$ obtained by frequency converting the output from the low-pass filter 45 (FIG. 4). The spread second pilot signal is frequency converted to a signal of the frequency band adjacent the transmission frequency band FB. The spectrum of the output from the main amplifier 19 is depicted in FIG. 9D. The spread second pilot signal $PL_{S2}$ is buried in a nonlinear distortion component $D_M$ generated by the main amplifier 19. The output spectrum of the low-pass filter 62 in FIG. 5 is depicted in FIG. 9E. In FIG. 9E there are shown the nonlinear distortion component $D_M$ by the main amplifier 19, frequency-converted from the transmission frequency band to the base band and the spread second pilot signal $PL_{S2}$. In this way, the distortion component $D_M$ is band-limited by the low-pass filter 62. Shown in FIG. 9F is the spectrum of the output despread by the spreading code after being converted to digital form. As shown in FIG. 9F, the second pilot signal $PL_{S2}$ buried in the out-of-band, nonlinear distortion component $D_M$ generated by the main amplifier 19 can be extracted by digital signal processing.

Figure 10:
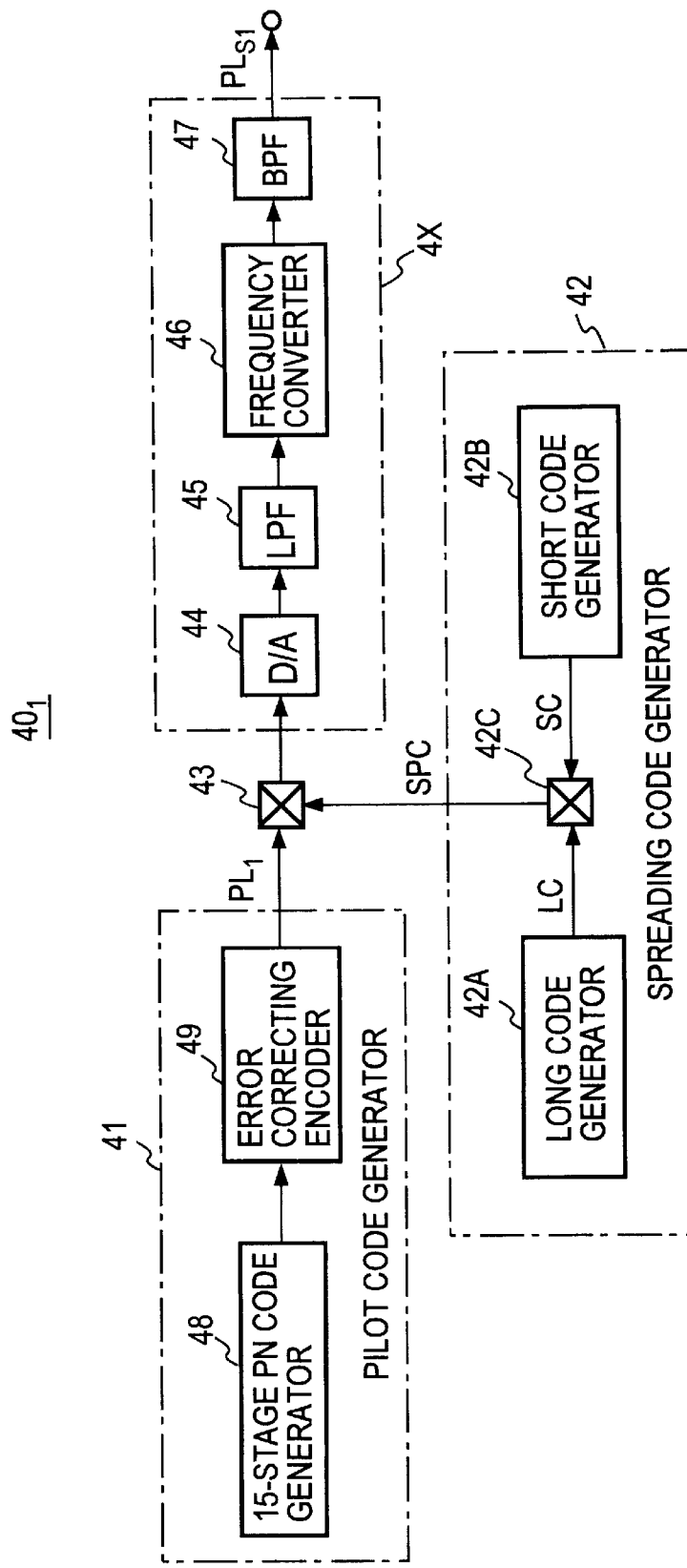
FIG. 10 is a block diagram illustrating an example of the configuration of a pilot signal generator utilizing an error correcting code scheme.

The first and second pilot signal generators $40_1$ and $40_2$ may be configured as illustrated in FIG. 10, in which the parts corresponding to those in FIG. 4 are identified by the same reference numerals. In FIG. 10 the pilot code is encoded by an error correcting encoder 49 in the pilot code generator 41 to obtain the pilot code. The error correcting encoder 49 may be formed using a known encoder for a BCH code, a convolution code, or the like. The illustrated pilot signal generator is identical in construction with that of FIG. 4 except the above.

Figure 11:
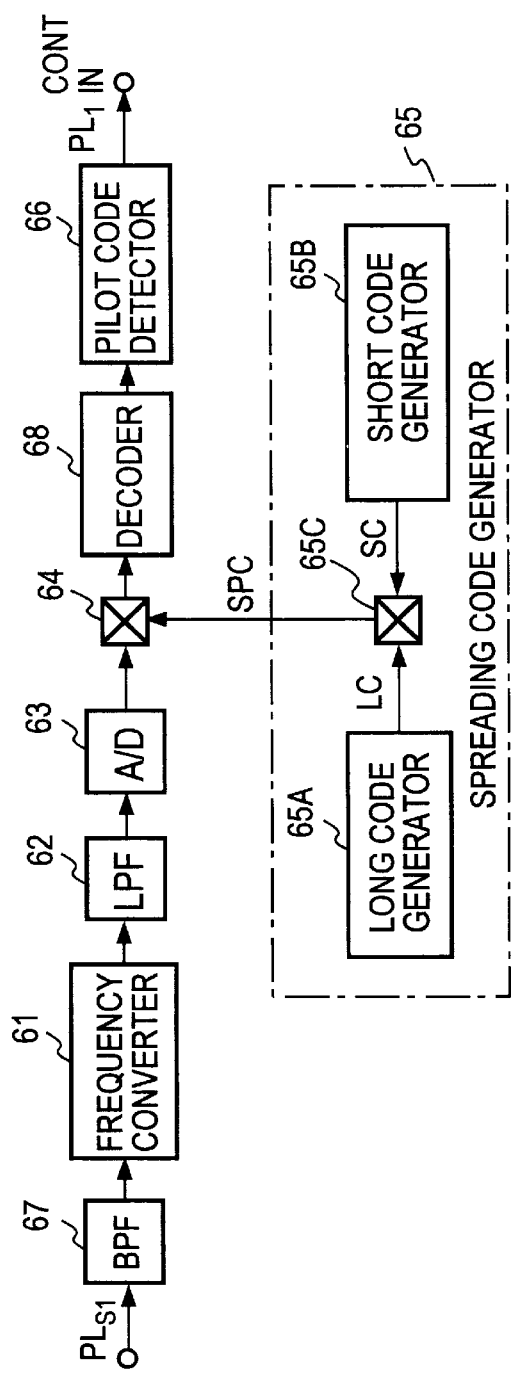
FIG. 11 is a block diagram illustrating an example of the configuration of a pilot signal detector utilizing a decoded version of an error correcting code.

When the pilot code is encoded to an error correcting code as mentioned above, the pilot level detectors $60_1$ and $60_2$ are each configured as depicted in FIG. 11, in which the parts corresponding to those in FIG. 5 are identified by the same reference numerals. That is, the despread output from the digital multiplier 64 is decoded by a decoder 68 and its decoded output is fed to the pilot code detector 66. The decoder 68 corresponds to the error correcting encoder 49 in FIG. 10, and it may be formed using a block code decoder or a convolution decoder based on the Viterbi algorithm. The FIG. 10 configuration for the pilot signal generators $40_1$ and $40_2$ which performs the error correcting encoding scheme and the FIG. 11 configuration for the pilot level detectors $60_1$ and $60_2$ which decodes the error correcting code are both also applicable to all the embodiments described later on.

Figure 12:
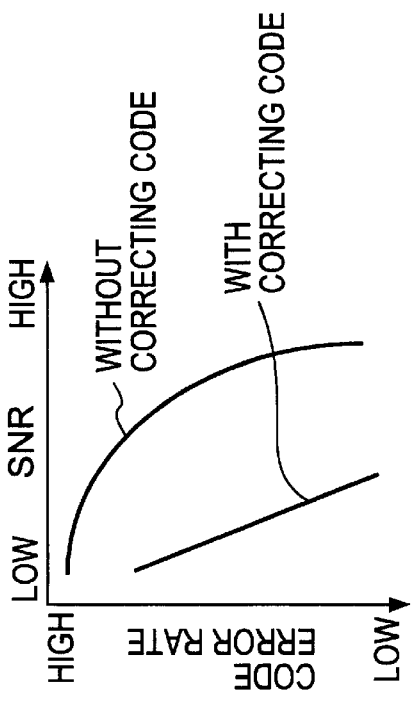
FIG. 12 is a graph for explaining the effect that is produced by the use of the error correcting code scheme.

Now, a description will be given of the effect of encoding the first and second pilot signals into error correcting codes. In FIG. 12 there is shown the pilot signal detection accuracy in the cases where the error correcting code is used and where it is not used. The ordinate represents the code error rate and the abscissa the SN (Signal-to-Noise) ratio. As will be seen from FIG. 12, the use of the error correcting code improves the code error rate with less SN ratio. This means that the use of the error correcting code enables the pilot signal to be detected at lower pilot signal level. As a result, the pilot signal level can be further lowered.

Figure 13:
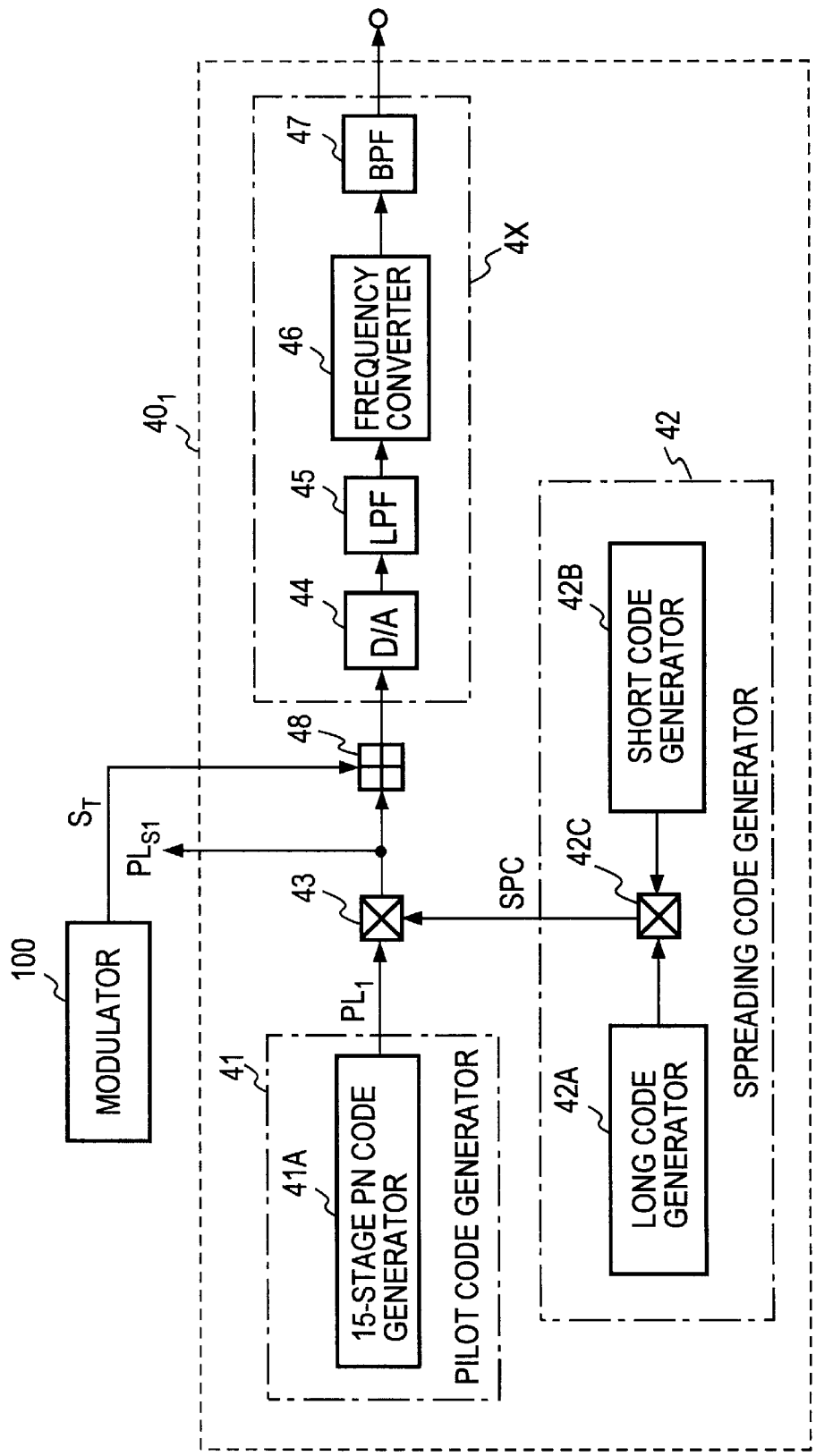
FIG. 13 is a block diagram illustrating an example of the configuration of a pilot signal generator of the type that adds a pilot signal to a base band transmission signal.

In the first embodiment, the input transmission signal has been described to be a high-frequency signal (a carrier-modulated signal in the transmission frequency band) and provided via the first pilot multiplexer 32 (FIG. 3) to the power divider 25, but when the input transmission signal is a digital signal of the base band, the first pilot signal generator $40_1$ may be configured as depicted in FIG. 13. The illustrated configuration has an adder 48 disposed between the multiplier 43 and the DA converter 44 in the FIG. 4 configuration. The base-band digital transmission signal $S_T$ from a modulator 100 disposed outside the feed-forward amplifier of the present invention is applied to the adder 48, by which it is added to the spread pilot signal $PL_{S1}$ provided from the multiplier 43. The adder output is converted by the DA converter 44 to an analog signal, which is converted by the frequency converter 46 to a high-frequency signal after being band-limited by the low-pass filter 45 as is the case with the FIG. 4 example. The converted output is applied to the band-pass filter 47, wherein its high-frequency component outside the predetermined frequency band is removed, and the first pilot signal $PL_{S1}$ and the transmission signal $S_T$ are provided in multiplexed form to the power divider 25 (FIG. 3). Such a configuration of the pilot signal generator as depicted in FIG. 13 is also applicable to all the embodiments described later on. In FIG. 13 the pilot signal $PL_{S1}$ of the base band that is taken out from the output of the multiplier 43 to the outside of the pilot signal generator $40_1$ when the FIG. 13 configuration is applied to the embodiments described later on. The combination of first and second pilot signals may be combination of a spread and an unspread pilot signal. Moreover, the first and second pilot signals may be injected into either of the inside and outside of the transmission frequency band.

Second Embodiment

To multiplex the pilot signal onto the transmission signal, the level of the pilot signal needs to be held below a predetermined value. In the CDMA radio communication, in particular, an increase in noise power in the receiving frequency band causes a decrease in the subscriber capacity. Hence, in the feed-forward amplifier for the CDMA radio communication it is necessary that the level of the pilot signal be sufficiently lower than the level of the transmission signal. However, this gives rise to the problem of decreased accuracy in the detection of the pilot signal level. This embodiment is intended to solve this problem as described below.

Figure 14:
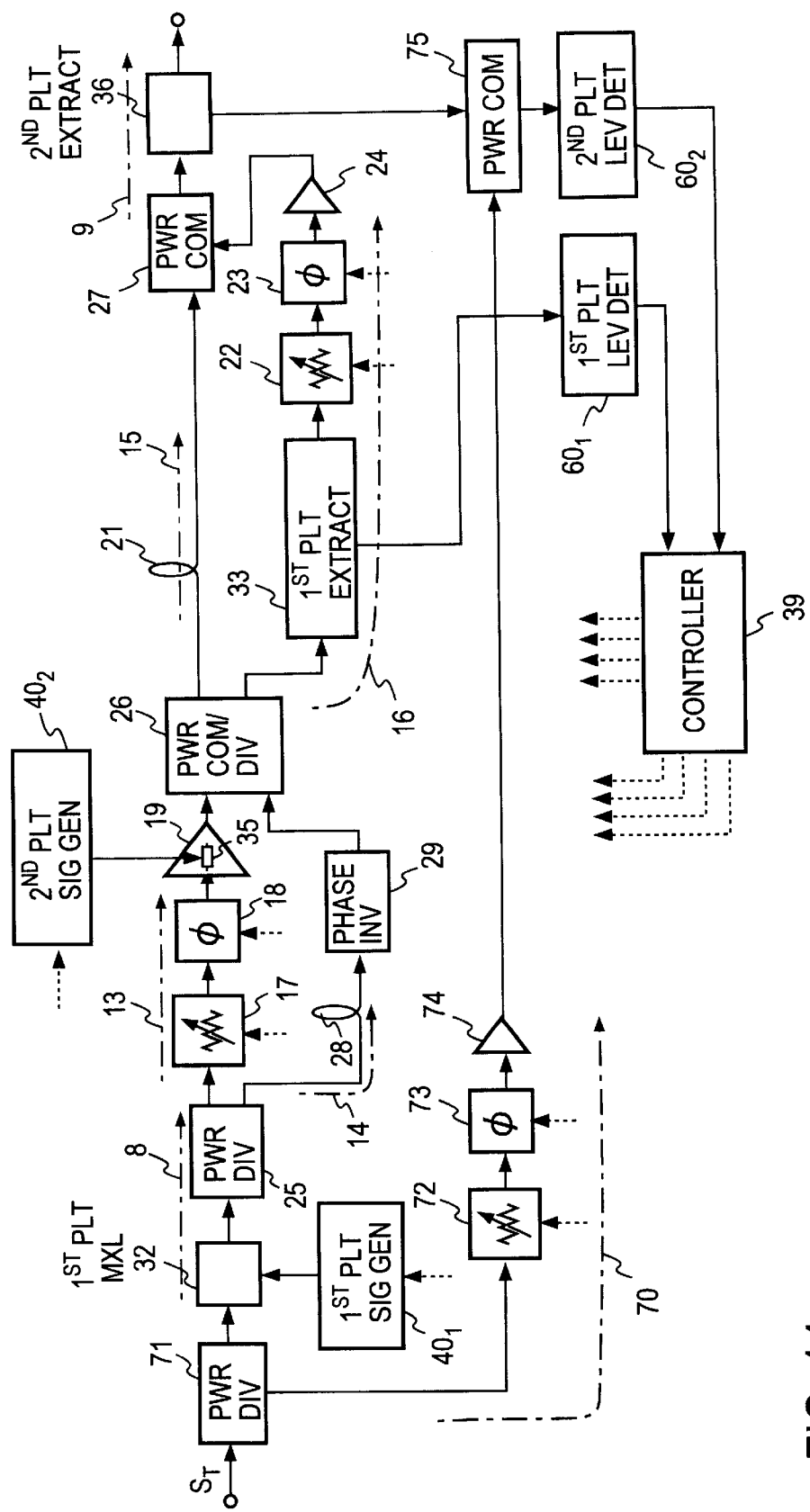
FIG. 14 is a block diagram illustrating the configuration of a second embodiment of the feed-forward amplifier according to the present invention.
Figure 15A:
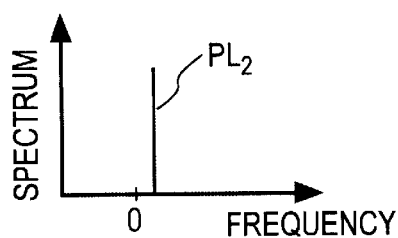
FIG. 15A is a diagram depicting the spectrum of a second pilot signal in the FIG. 14 embodiment.
Figure 15B:
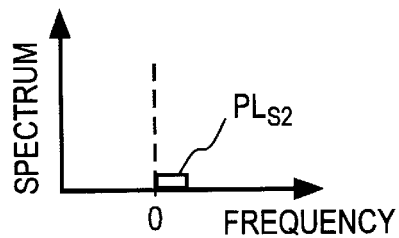
FIG. 15B is a conceptual diagram depicting the spectrum of a spread second pilot signal in the FIG. 14 embodiment.
Figure 15C:
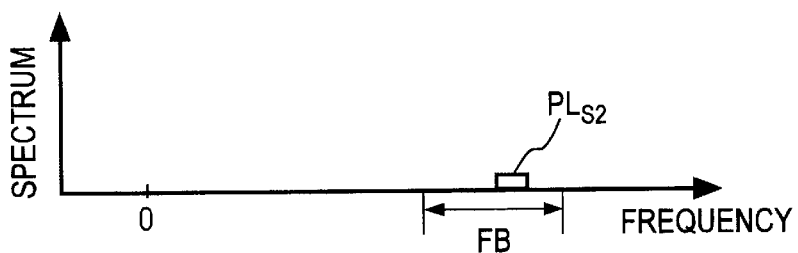
FIG. 15C is a conceptual diagram depicting the spectrum of an up-converted second pilot signal in the FIG. 14 embodiment.
Figure 15D:
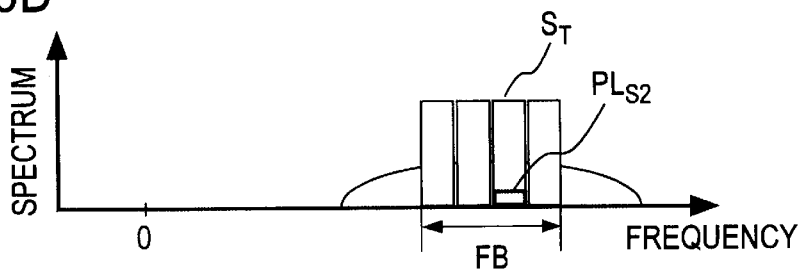
FIG. 15D is a conceptual diagram depicting the spectra of an up-converted high-frequency transmission signal and the second pilot signal.
Figure 15E:
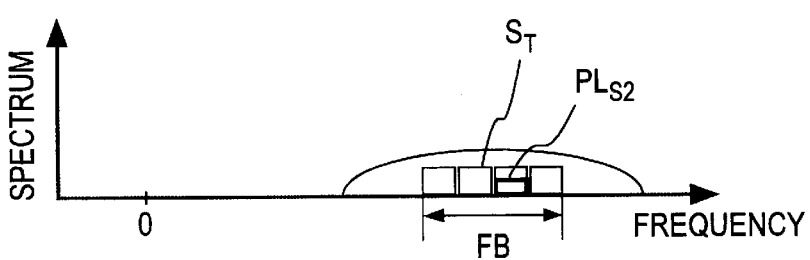
FIG. 15E is a conceptual diagram depicting the spectra of a transmission signal suppressed by a signal from a transmission signal canceling path and the second pilot signal in a power combiner.
Figure 15F:
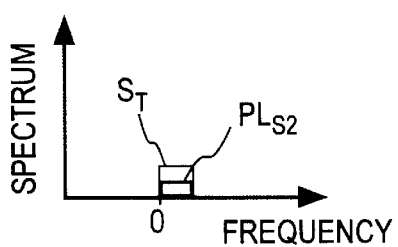
FIG. 15F is a conceptual diagram dipicting the spectra transmission frequency band converted from the transmission frequency band to the base and a second pilot signal.
Figure 15G:
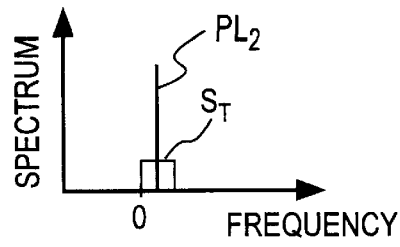
FIG. 15G is a conceptual diagram depicting the spectra of a pilot signal and the suppressed transmission signal both obtained by dispreading.

FIG. 14 illustrates in block form a second embodiment of the feed-forward amplifier according to the present invention. In this embodiment, however, the second pilot signal is multiplexed onto the transmission signal. The amplifier of this embodiment differs from the amplifier of the FIG. 3 embodiment only in the additional provision of a transmission signal cancellation path 70 for canceling the transmission signal; therefore, the parts corresponding to those in FIG. 3 are identified by the same reference numerals and no description will be repeated. The transmission signal cancellation path 70 comprises a power divider 71, a variable attenuator 72, a variable phase shifter 73, an auxiliary amplifier 74 and a power combiner 75. The power combiner 75 is connected between the second pilot signal extractor 36 and the second pilot level detector $60_2$. The power combiner 75 combines the output from the second pilot signal extractor 36 and the transmission signal component fed via the transmission signal cancellation path 70, and provides the combined output to the second pilot level detector $60_2$.

The transmission signal $S_T$ input into the feed-forward amplifier is divided by the power divider 71 to two signals that are provided onto the input path 8 and the transmission signal cancellation path 70. The variable attenuator 72 and the variable phase shifter 73 are controlled by the controller 39 on a stepwise basis so that the electrical length of the transmission signal cancellation path 70 to the power combiner 75 and the total electrical length of the main amplifier signal path 13, the distortion signal path 15 and the path via the second pilot signal extractor 36 are equal but opposite in phase, that is, so that the second pilot signal detection level is minimized. As a result, the transmission signal component in the output from the second pilot signal extractor 36 can be cancelled to some extent by the transmission signal fed via the transmission signal cancellation path 70 to the power combiner 75. The extent of cancellation of the transmission signal is controlled by the auxiliary amplifier 74. This facilitates the detection of the spread second pilot signal $PL_{S2}$. Then, as is the case with the FIG. 3 embodiment, the variable attenuator 17 and the variable phase shifter 18 are adjusted to minimize the detection level of the first pilot level detector $60_1$, and the variable attenuator 22 and the variable phase shifter 23 are similarly adjusted to minimize the detection level of the second pilot level detector $60_2$. This embodiment is identical in construction with the first embodiment except the above.

FIG. 15 shows the spectrum of the second pilot signal at the respective part in the second embodiment. Shown in FIG. 15A is the spectrum of the second pilot code $PL_2$ output from the pilot code generator 41. In this example, too, the second pilot code PL2 has a spectrum of a single-frequency signal. Shown in FIG. 15B is the spectrum of the pilot signal $PL_{S2}$ spread by the spreading code SPC. Shown in FIG. 15C is the output spectrum obtained by frequency converting the output of the low-pass filter 45. The spread second pilot signal $PL_{S2}$ is frequency-converted to a signal of the transmission frequency band FB. Shown in FIG. 15D is the output spectrum of the second pilot signal extractor 36. In this example, too, the four-carrier amplification is assumed. As depicted in FIG. 15d, the second pilot signal $PL_{S2}$ is superimposed on the transmission signal $S_T$. In FIG. 15E the output from the auxiliary amplifier 74 of the transmission signal cancellation path 70 and the output from the second pilot signal extractor 36 are combined by the power combiner 75. In this case, the variable attenuator 72 and the variable phase shifter 73 are controlled by the controller 39 on a step-by-step basis so that the electrical length of the transmission signal cancellation path 70 containing the auxiliary amplifier 74 and the total electrical length of the main amplifier signal path 13, the distortion signal path 15 and thence to the power combiner 75 are equal but opposite in phase to each other as described previously. By this, the transmission signal $S_T$ with the spread second pilot signal $PL_{S2}$ multiplexed thereon is suppressed to some extent as depicted in FIG. 15E. FIG. 15F depicts the output spectrum of the low-pass filter 62 in FIG. 5. Shown in FIG. 15F are the spectra of the transmission signal component frequency converted from the transmission frequency band to the base band and the second pilot signal $PL_{S2}$. The transmission signal $S_T$ with the second pilot signal $PL_{S2}$ superimposed thereon is band limited by the low-pass filter 62. Shown in FIG. 15G is the spectrum of the output converted to digital form and despread by the spreading code SPC. As depicted, the second pilot code $PL_2$ superimposed on the transmission signal $S_T$ can easily be extracted by digital signal processing.

The first and second pilot signal generators $40_1$ and $40_2$ may each have the same configuration as shown in FIG. 10. The arrangement shown in FIG. 14 for suppressing the transmission signal in the detection of the level of the second pilot signal can be applied to all the embodiments described below.

Third Embodiment

Figure 16:
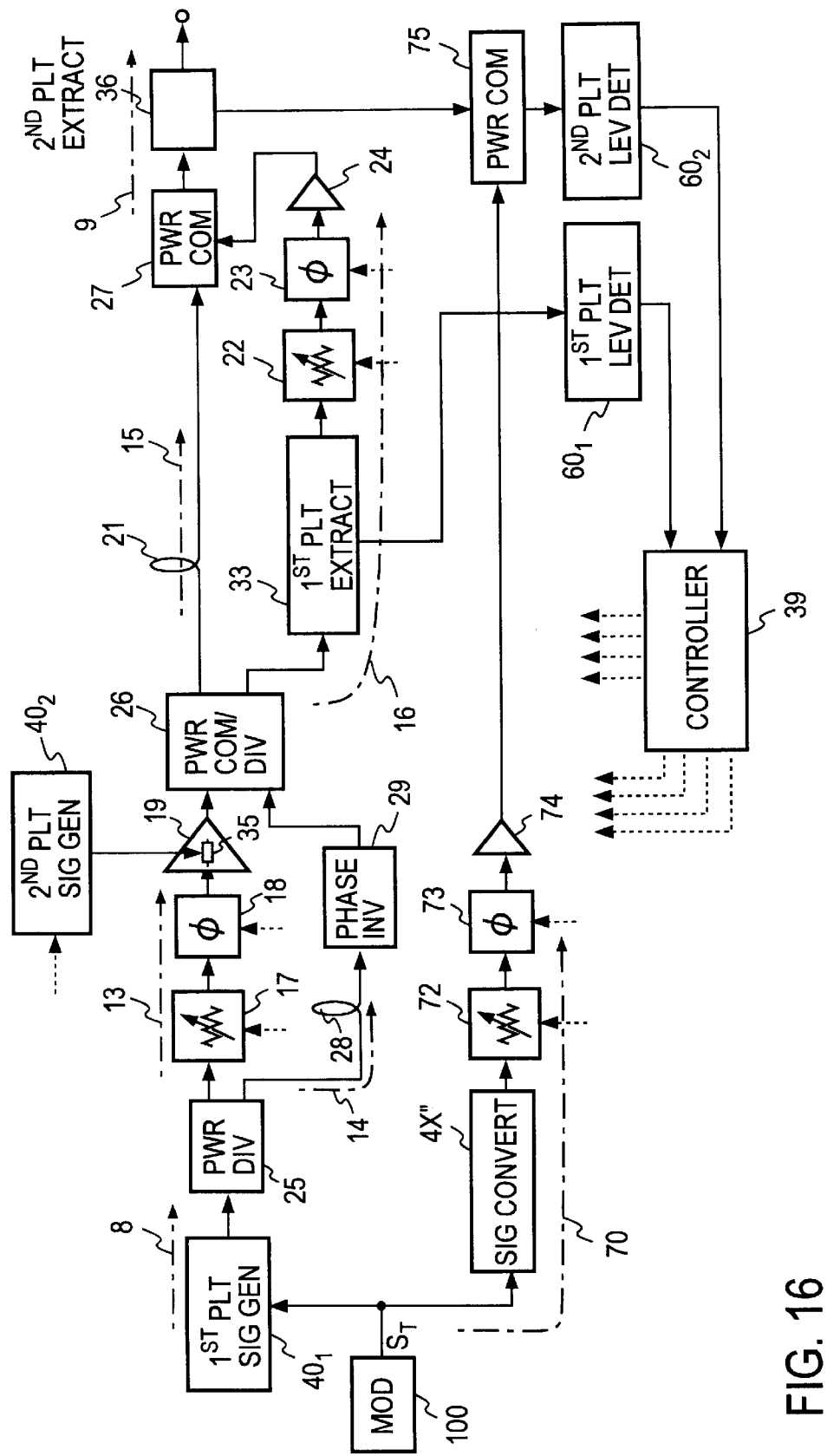
FIG. 16 is a block diagram illustrating the configuration of the feed-forward amplifier according to a third embodiment of the present invention.

FIG. 16 illustrates in block form a modification of the FIG. 14 embodiment which employs the pilot signal generator $40_1$ that is used in the case of multiplexing the transmission signal and the first pilot signal in the base band as described previously with reference to FIG. 13. The transmission signal $S_T$ and the first pilot signal $PL_{S1}$ are multiplexed as digital signals by the adder 48, then the multiplexed output is converted to an analog signal and further converted to a transmission signal of the transmission frequency band, thereafter being provided to the power divider 25 in FIG. 16. On the other hand, the base-band digital transmission signal $S_T$ is also fed into a signal conversion part 4X" of the same construction as that 4X in FIG. 13, wherein it is similarly converted to a signal of the transmission frequency band, and the converted signal is applied to the variable attenuator 72. This transmission signal is provided via the variable phase shifter 73 and the auxiliary amplifier 74 to the power combiner 75, wherein it is used to cancel the transmission signal component contained in the extracted output from the second pilot signal extractor 33. The operations and control of the other parts in this embodiment are the same as in FIGS. 14 and 15. In this way, the transmission signal can be cancelled even if the transmission signal and the pilot signal are multiplexed in digital form.

Fourth Embodiment

Figure 17:
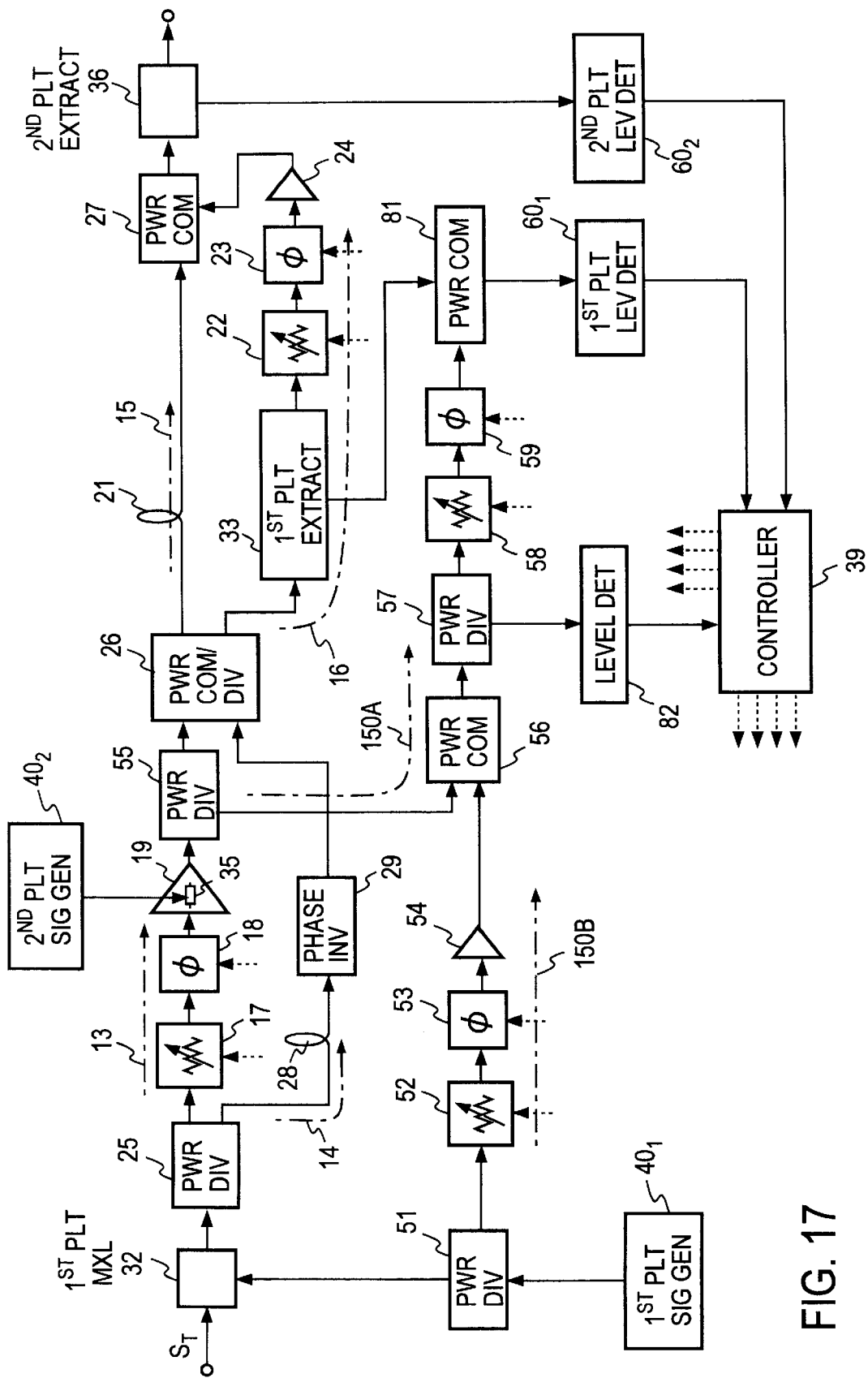
FIG. 17 is a block diagram illustrating the configuration of a feed-forward amplifier according to a fourth embodiment of the present invention.

The input signal to the first pilot signal extractor 33 in the FIG. 3 embodiment contains a detected but unsuppressed amplifier distortion component as well as the first pilot signal component. The amplifier distortion component acts as noise in the first pilot level detection, and hence it is not preferable. FIG. 17 illustrates in block form an embodiment of the present invention that aims at solving this problem.

The feed-forward amplifier shown in FIG. 17 has a configuration in which an amplifier output signal cancellation path 150A and a pilot signal cancellation path 150B are added to the feed-forward amplifier of the FIG. 3 embodiment. The amplifier output signal cancellation path 150A is made up of a power divider 55, a power combiner 56, a power divider 57, a variable attenuator 58, a variable phase shifter 59 and a power combiner 81. The output from the main amplifier 19 is divided by the power divider 55 to inputs to the power combiners 26 and 56. The output from the power combiner 56 is divided by the power divider 57 to inputs to the variable phase attenuator 58 and a level detector 82. The output from the variable attenuator 58 is provided via the variable phase shifter 59 to the power combiner 81, wherein it is combined with the output from the first pilot signal extractor 33. The combined output is fed to the first pilot level detector $60_1$.

The pilot signal cancellation path 150B is made up of a power divider 51, a variable attenuator 52, a variable phase shifter 53, an auxiliary amplifier 54 and the power combiner 56. The first pilot signal $PL_{S1}$ available from the first pilot signal generator $40_1$ is divided by the power divider 51 to inputs to the first pilot multiplexer 32 and the variable attenuator 52. The output to the variable attenuator 52 is provided via the variable phase shifter 53 and the auxiliary amplifier 54 to the power combiner 56, wherein it is combined with the amplifier output from the power divider 55. The output from the power combiner 57 is fed to the level detector 82. The output from the level detector 82 is provided to the controller 39 wherein it is used to control the variable attenuator 52 and the variable phase shifter 53.

Figure 18:
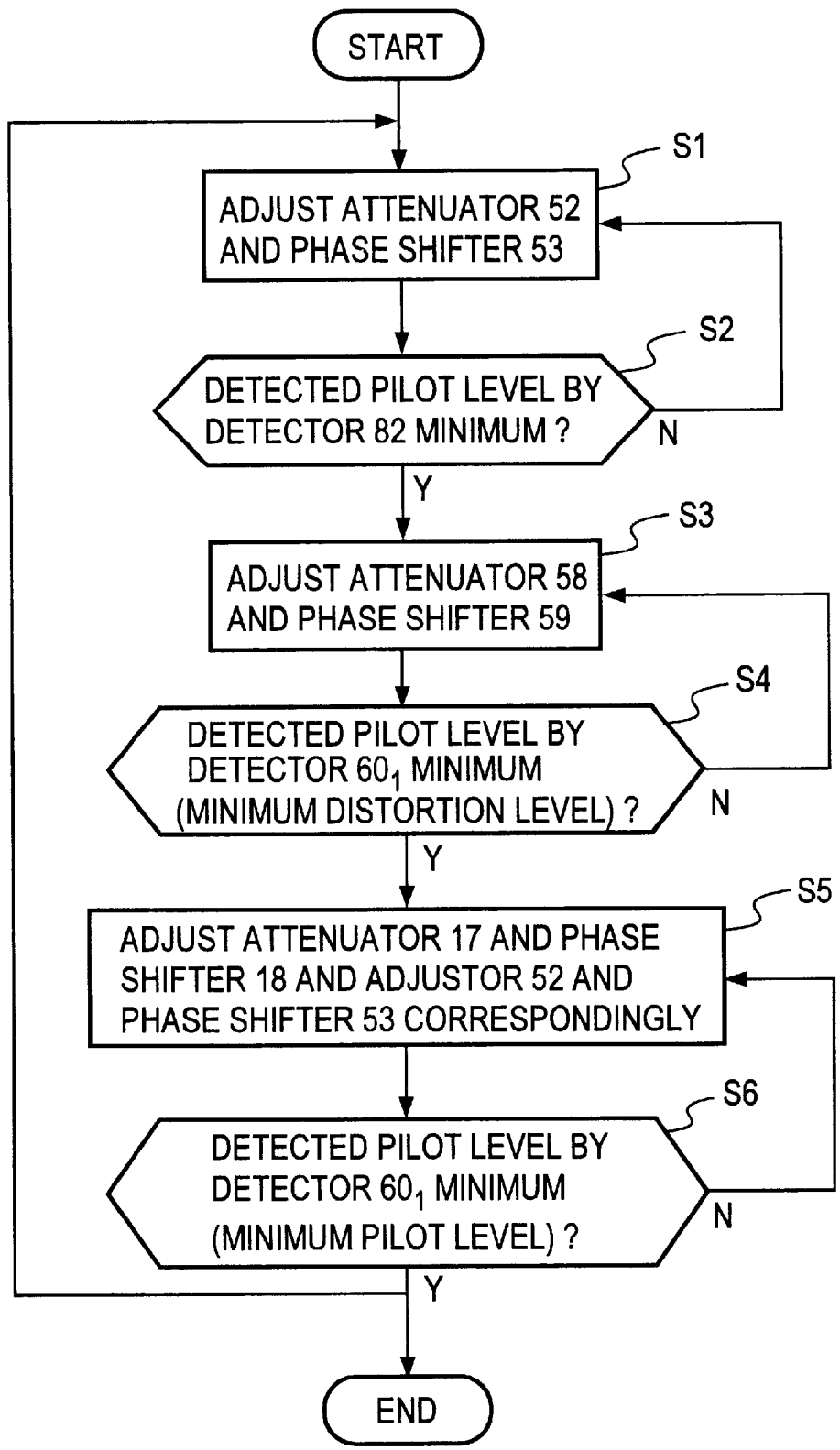
FIG. 18 is a flowchart showing a balance adjustment procedure in the amplifier of FIG. 17.

Since the level of the second pilot signal is detected by the same operation as in the first embodiment, no description will be repeated. A description will be given below of the detection of the first pilot signal level. FIG. 18 is a basic flowchart of an algorithm for controlling the variable attenuator 17, 52 and 58 and the variable phase shifters 18, 53 and 59 by driving, for example, a microprocessor that forms the controller 39 in FIG. 17.

This flowchart consists of four stages. The first stage is to control the variable attenuator 52 and the variable phase shifter 53 step by step in such a manner as to minimize the level that is detected by the level detector 82 (S1, S2). Such control can be effected using a known adaptive control algorithm such as a perturbation, steepest descent or least square estimation method. The variable attenuator 52 and the variable phase shifter 53 are adjusted by this control so that the pilot signal component fed from the main amplifier 19 to the power combiner 56 and the pilot signal fed thereto from the auxiliary amplifier 54 are equal in amplitude and in delay but opposite in phase, that is, so that the detection level by the level detector 82 is minimized. This permits removal of the pilot signal component in the amplifier output signal cancellation path 150A. The signal components remaining in the output of the power combiner 56 at this time are the transmission signal component and the distortion component that the main amplifier 19 generates.

The second stage is to similarly control the variable attenuator 58 and the variable phase shifter 59 step by step in such a manner as to minimize the level that is detected by the first pilot level detector $60_1$ (S3, S4). At this time, the output from the first pilot signal extractor 33 contains the main distortion component by the main amplifier 19, the suppressed transmission signal component and the first pilot signal component. The variable attenuator 58 and the variable phase shifter 59 are controlled by the controller 38 so that the output from the variable phase shifter 59 becomes equal in amplitude and in delay but opposite in phase to the output from the first pilot signal extractor 33 in the power combiner 81. By minimizing the output from the first pilot level detector 601, the distortion component by the main amplifier 19 can be cancelled in the power combiner 81. As a result, the output from the power combiner 81 contains substantially the first pilot signal component and the transmission signal component alone.

The third stage is to control the variable attenuator 17 and the variable phase shifter 18 in such a manner as to minimize the output level of the first pilot level detector $60_1$ (S5, S6). Since the optimum value previously adjusted in the variable attenuator 52 and the variable phase shifter 53 is displaced by the adjustment of the variable attenuator 17 and the variable phase shifter 18, it is necessary to control the variable attenuator 52 and the variable phase shifter 53 in association with the adjustment of the variable attenuator 17 and the variable phase shifter 18. This can be done, for example, by making the same adjustments to the variable attenuator 52 and the variable phase shifter 53 as the adjustments to the attenuator 17 and the phase shifter 18. As a result, only the suppressed transmission signal and the pilot signal can be detected by the first pilot signal level detector $60_1$. This means that the input signal component to the level detector 82 is equivalent to the distortion component by the main amplifier 19. Accordingly, the distortion component generated by the main amplifier 19 is cancelled in the power combiner 81 by the processing of steps S3 and S4, making it possible to detect the first pilot signal.

The fourth stage is to repeat the first to third stages as required, thereby providing increased stability of the accuracy in the detection of the first pilot signal.

In any of the above control schemes, the output levels of the level detectors $60_1$ and 82 are controlled to be minimum, but they need not be minimized when predetermined electric performance can be achieved. While this embodiment has been described to use two level detectors, it is also possible to time-share one level detector.

Fifth Embodiment

Figure 19:
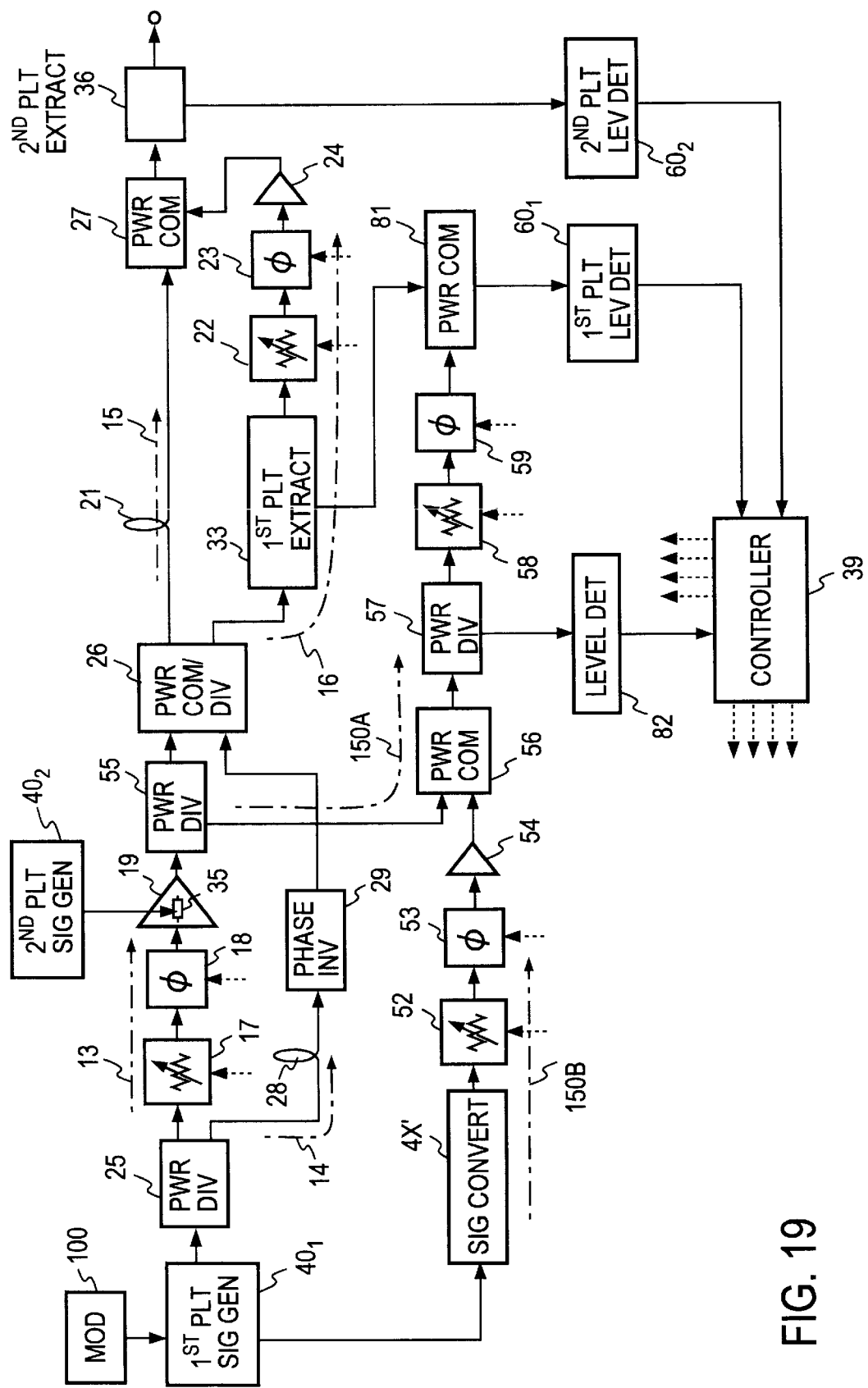
FIG. 19 is a block diagram illustrating the configuration of a feed-forward amplifier according to a fifth embodiment of the present invention.

FIG. 19 illustrates in block form a fifth embodiment of the present invention in which the pilot signal generator $40_1$ shown in FIG. 13 is applied to the FIG. 17 embodiment. As described previously with reference to FIG. 17, the transmission signal $S_T$ and the first pilot signal $PL_{S1}$ are multiplexed in digital form by the adder 48, then the multiplexed output is converted to analog form, thereafter being converted to a transmission signal of the transmission frequency band and input into the power divider 25 in FIG. 19. On the other hand, the pilot signal $PL_{S1}$ spread in the multiplier 43 is also fed to a signal conversion part 4X' of the same construction as that of the signal conversion part 4X in FIG. 13, then similarly converted therein to a signal of the transmission frequency band and provided to the variable attenuator 52 of the pilot signal cancellation path 150B. The pilot signal $PL_{S1}$ is provided via the variable phase shifter 53 and the auxiliary amplifier 54 to the power combiner 56, wherein it is used to cancel the pilot signal component that passes over the main amplifier output signal cancellation path 150A. The operations and control of the other parts of this embodiment are the same as described previously in respect of FIGS. 17 and 18. Accordingly, the pilot signal in the amplifier output signal cancellation path 150A can be cancelled as well in an embodiment in which the transmission signal and the pilot signal depicted in FIG. 19 are multiplexed as base-band digital signals.

Sixth Embodiment

Figure 20:
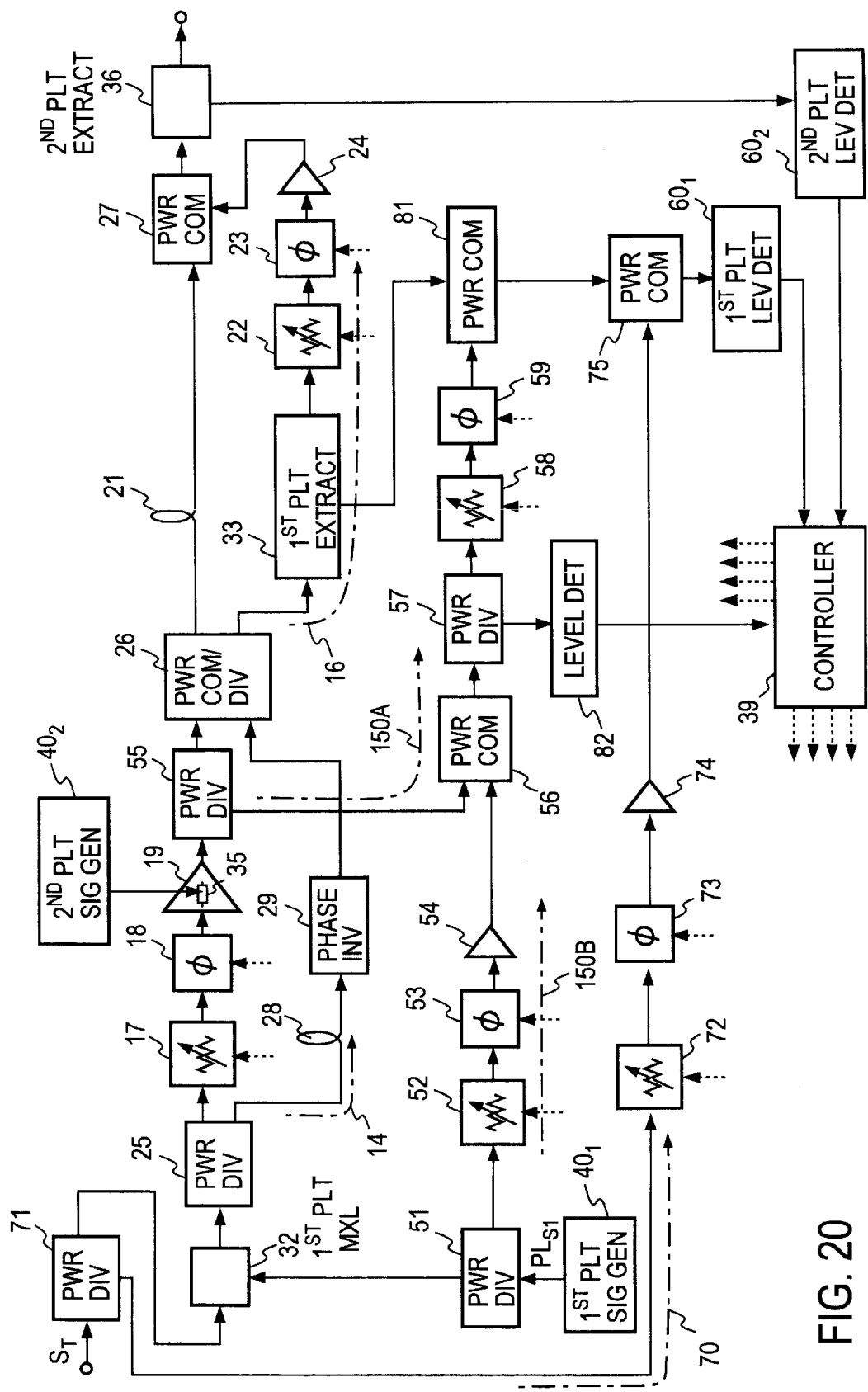
FIG. 20 is a block diagram illustrating the configuration of a feed-forward amplifier according to a sixth embodiment of the present invention.

FIG. 20 illustrates in block form a fourth embodiment of the feed-forward amplifier according to the present invention, in which the transmission signal cancellation path 70 in FIG. 14 is added to the third embodiment (FIG. 17). The transmission signal cancellation path 70 includes the power divider 71 connected in series to the input of the pilot multiplexer 32, a series connection of the variable attenuator 72, the variable phase shifter 73 and the auxiliary amplifier 74 through which the transmission signal divided by the power divider 71 passes one after another, and the power combiner 75 which is supplied with the output from the auxiliary amplifier 74. The power combiner 76 combines the output from the power combiner 81 and the output from the auxiliary amplifier 74, and provides the combined output to the first pilot level detector $60_1$. The controller 38 controls the variable attenuator 72 and the variable phase shifter 73 as well as those in the third embodiment. The control operation will be described below with reference to the flowchart of FIG. 21.

Figure 21:
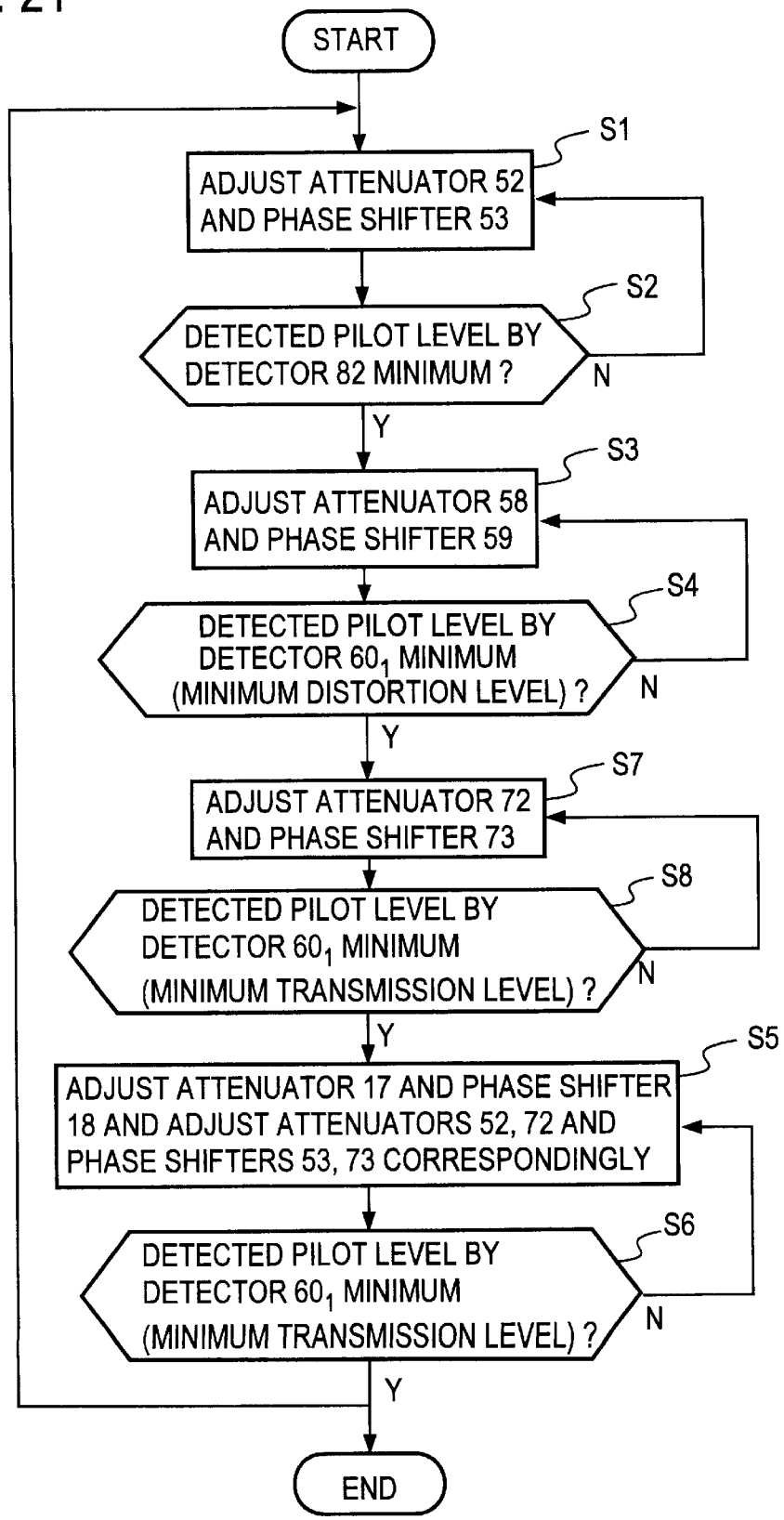
FIG. 21 is a flowchart showing a balance adjustment procedure in the amplifier of FIG. 20.

The control procedure of FIG. 21 for the fourth embodiment includes the following stage (steps S7, S8) after the second stage (steps S3, S4) of the control procedure of FIG. 18 for the third embodiment. The added stage (steps S7, S8) will hereinafter be referred to as a third stage and the third and fourth stages (steps S5, S6) and (repetition of steps S1 to S6) in FIG. 18 as fourth and fifth stages, respectively.

The third stage is to control the variable attenuator 72 and the variable phase shifter 73 in such a manner as to minimize the output from the first pilot level detector $60_1$ (S7, S8). Through this control, the variable attenuator 72 and the variable phase shifter 73 are adjusted so that the inputs to the power combiner 75 from the power combiner 81 and the auxiliary amplifier 74 become equal in amplitude and in delay but opposite in phase in the power combiner 75. As a result, the transmission signal provided to the power combiner 75 via the path 150A can be cancelled.

The fourth stage is to control the variable attenuator 17 and the variable phase shifter 18 in such a manner as to minimize the output from the first pilot level detector 601.

At this time, the displacement of the variable attenuators 52, 72 and the variable phase shifters 53, 73 from their previously adjusted optimum operating points is adjusted by setting therein the amounts of adjustment for the variable attenuator 17 and the variable phase shifter 18 as is the case with the FIG. 17 embodiment.

While in the above the outputs of the level detectors $60_1$ and 82 are controlled to be minimum, they need not always be minimized when a predetermined electrical performance is achieved; for instance, they may be close to the minimum values. This embodiment has been described to employ two level detectors $60_1$ and 82, but it is also possible to time-share one level detector.

Figure 22A:
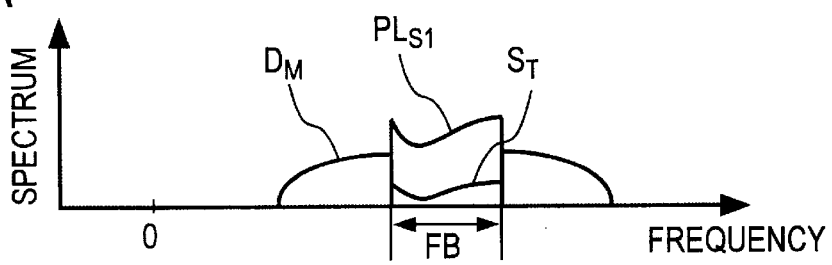
FIG. 22A is a conceptual diagram showing the spectrum of the output from a pilot signal extractor 33 in the embodiment of each of FIGS. 17 and 20.
Figure 29:
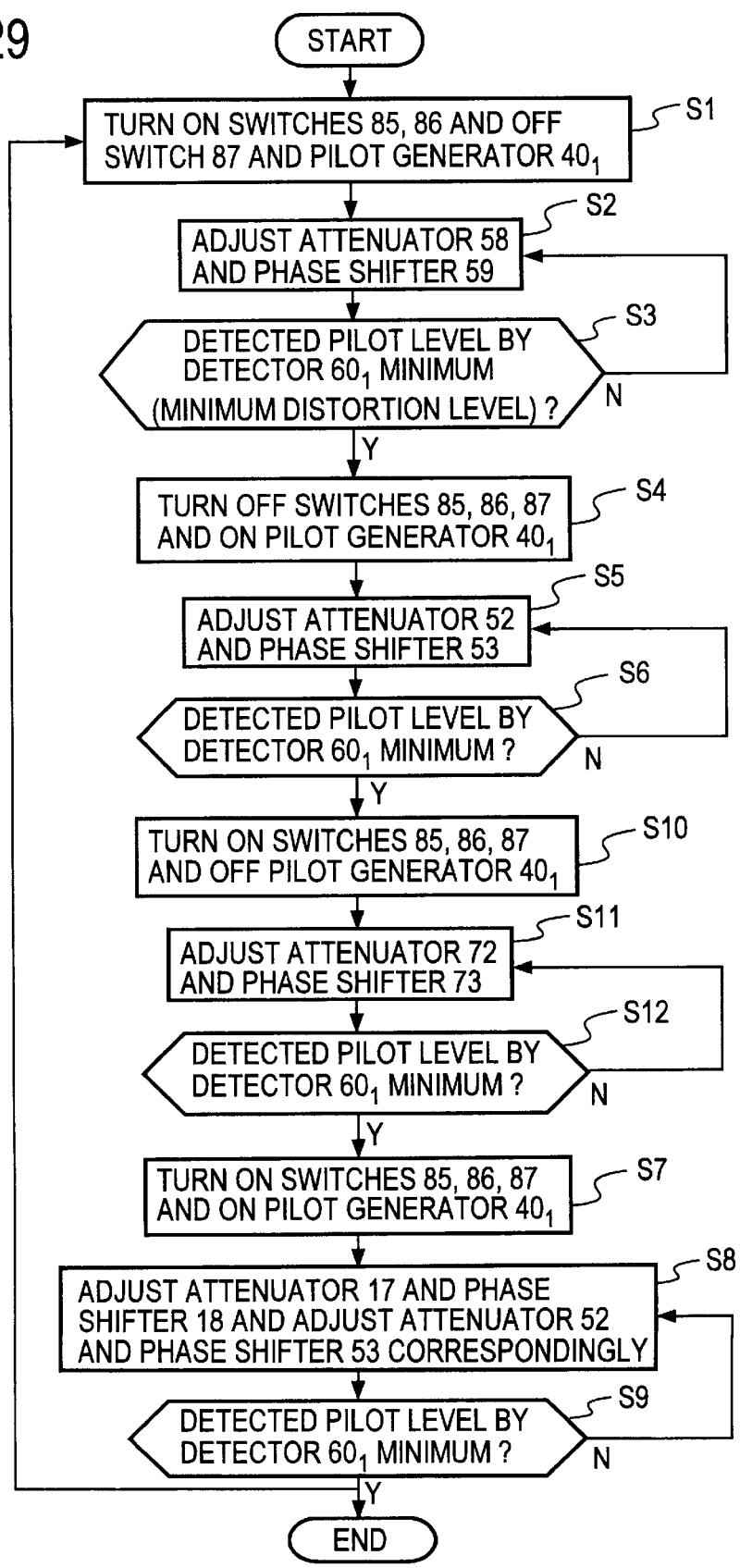
FIG. 29 is a flowchart showing a balance adjustment procedure in the amplifier of FIG. 27.

In the embodiments of FIGS. 17 and 29, the pilot signal generator $40_1$ has the same configuration as depicted in FIG. 4, for instance. The transmission signal $S_T$ and the spread first pilot signal $PL_{S1}$ are divided by the power divider 25 to the main amplifier signal path 13 and the linear signal path 14. In the main amplifier signal path 13 there are connected in series the variable attenuator 17, the variable phase shifter 18 and the main amplifier 19. In the linear signal path 14 there are connected in series the delay line 28 and the phase inverter 29. The signals on the two paths 13 and 14 are combined by the power combiner 26, and its output is provided to the first pilot signal extractor 33 in the distortion injection path 16. The first pilot signal extractor 33 is a directional coupler or the like as is the case with the pilot multiplexer 32. In FIG. 22A there is depicted the spectrum of a signal extracted by filtering the band component of the first pilot signal with a band-pass filter (not shown) of the first pilot signal extractor 33. Since the distortion component $D_M$ is not suppressed, it has a high level relative to the suppressed transmission signal $S_T$ and the first pilot signal $PL_{S1}$.

Figure 22B:
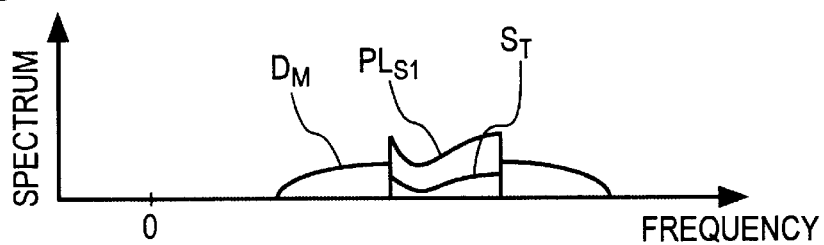
FIG. 22B is a conceptual diagram showing the spectrum of the output from a power combiner 81 in FIGS. 17 and 20.

The output from the first pilot signal extractor 33 is combined by the power combiner 81 with the signal fed thereto via the amplifier output signal cancellation path 150A, that is, the signal adjusted by the variable attenuator 58 and the variable phase shifter 59 to be equal in amplitude and in delay but opposite in phase to the output from the first pilot signal extractor 33. The spectrum of the combined signal is shown in FIG. 22B. Since the distortion component $D_M$ generated by the main amplifier 19 and the transmission signal $S_T$ are suppressed to some extent as depicted in FIG. 22B, the accuracy in detecting the first pilot signal $PL_{S1}$ can be increased accordingly.

Figure 23A:
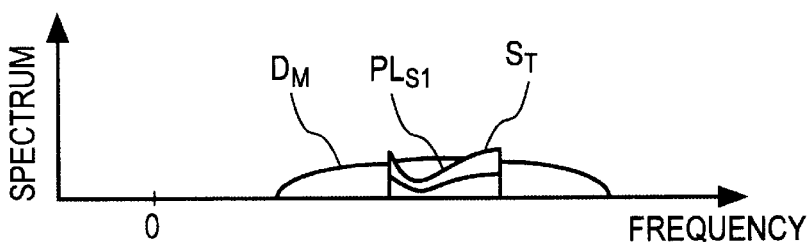
FIG. 23A is a conceptual diagram showing the spectrum of the output from a power combiner 75 in FIG. 20.

In the FIG. 20 embodiment, the signal on the transmission signal cancellation path 70 and the output signal from the power combiner 81 are combined by the power combiner 75. In the transmission signal cancellation path 70, the variable attenuator 72 and the variable phase shifter 73 are adjusted by the controller 39 so that the input signals to the power combiner 75 are equal in amplitude and in delay but opposite in phase to each other. An example of the output spectrum of the power amplifier 75 is shown in FIG. 23A. By combining the transmission signal $S_T$ from the transmission signal cancellation path 70 and the output from the power combiner 81 which are equal in amplitude and in delay but opposite in phase to each other, the transmission signal component fed via the path 150A to the power combiner 75 is cancelled and its level lowers as depicted in FIG. 23A. This further facilitates the detection of the first pilot signal $PL_{S1}$.

Figure 23B:
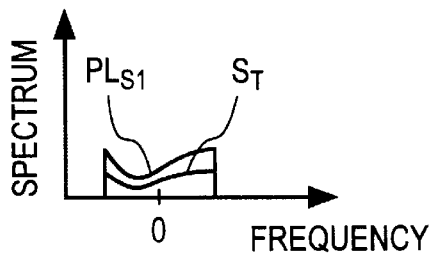
FIG. 23B is a conceptual diagram showing the spectra of a transmission signal and a pilot signal put back to the base band in a level detector $60_1$ in FIG. 20.
Figure 23C:
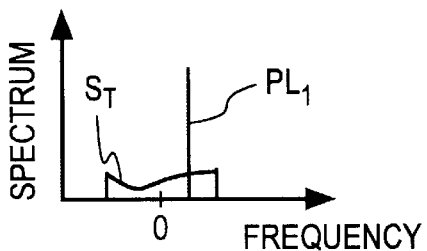
FIG. 23C is a conceptual diagram showing the spectra of the pilot signal and the transmission signal despread in the level detector $60_1$ in FIG. 20.

The output from the power combiner 75 is provided, for example, to the first pilot level detector $60_1$ shown in FIG. 5. The signal filtered by the low-pass filter 67 is frequency converted by the frequency converter 61 to a base band signal. The spectrum of the signal filtered by the low-pass filter 67 is depicted in FIG. 23B. At this time, the filtered signal has superimposed thereon the spread first pilot signal $PL_{S1}$ and the transmission signal $S_T$. The frequency-converted base band signal is converted by the AD converter 63 to a digital signal. The digital signal is provided to the multiplier 64, by means of which it is despread by being multiplied by the spreading code SPC generated from the short and long codes SC and LC. In consequence, the original first pilot code $PL_1$ is demodulated as shown in FIG. 23C, and the component of the first pilot code $PL_1$ can be extracted from the despread signal separately of the transmission signal $S_T$.

As described above, the FIG. 20 embodiment permits highly sensitive detection of the pilot signal with little influence thereon of the transmission signal $S_T$. Further, since the transmission signal $S_T$ is suppressed in the dispreading of the pilot signal, its level can be lowered. This means that even if the operation of the device is unstable, the pilot signal of no use by nature need not be sent out by radio waves into space.

In this embodiment, too, the pilot signal generator $40_1$ may be one that is provided with the error correcting encoder 49 as depicted in FIG. 10, and the first pilot level detector $60_1$ may be one that is provided with the decoder 66 as shown in FIG. 11.

Seventh Embodiment

Figure 24:
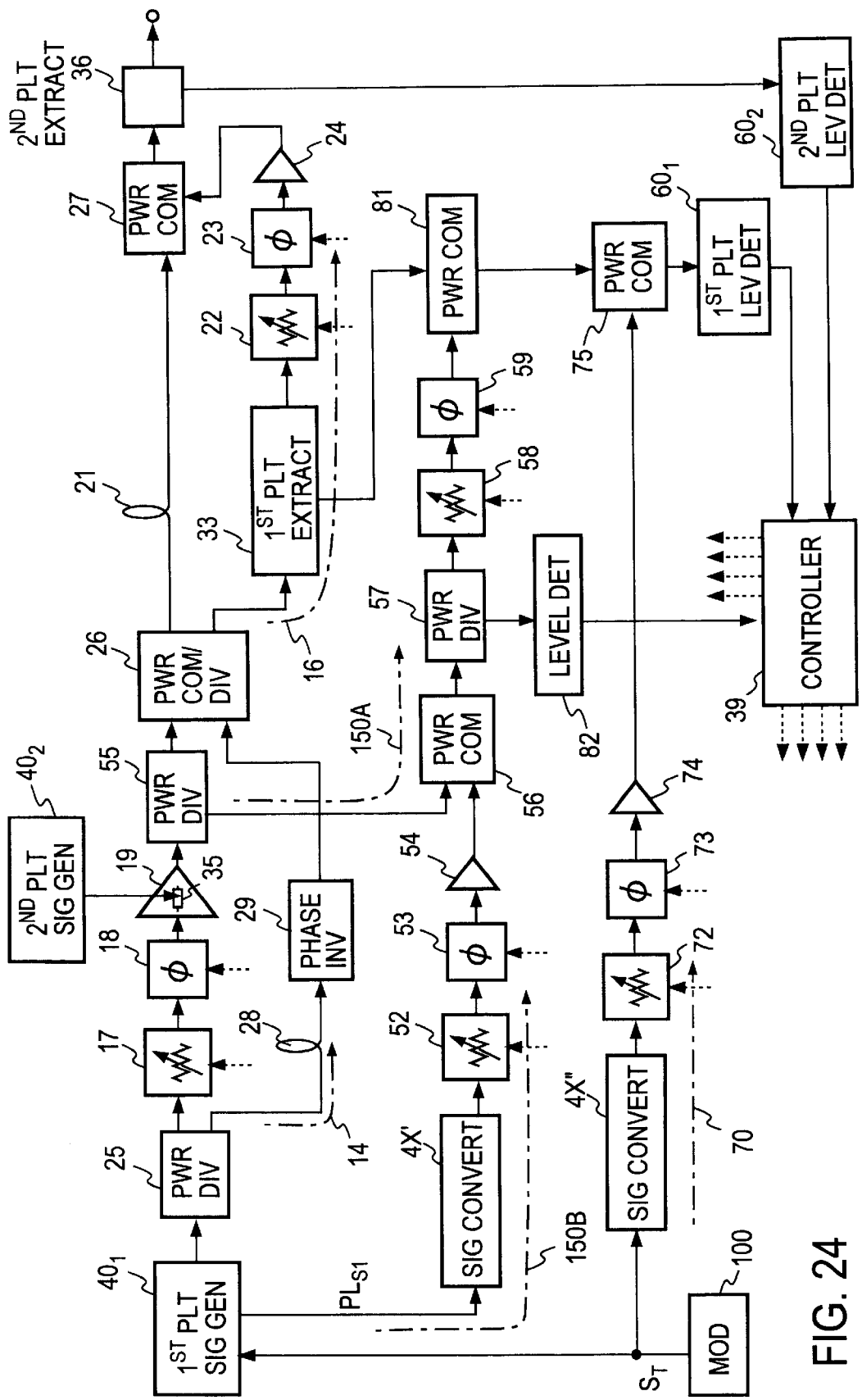
FIG. 24 is a block diagram illustrating the configuration of a feed-forward amplifier according to a seventh embodiment of the present invention.

FIG. 24 illustrates in block form a modification of the FIG. 20 embodiment which employs the first pilot signal generator $40_1$ shown in FIG. 13. The configuration of this embodiment is the same as a configuration in which the transmission signal cancellation path 70 in FIG. 16 is added to the FIG. 19 embodiment. As described previously with respect to FIG. 13, the transmission signal $S_T$ and the first pilot signal $PL_{S1}$ are multiplexed in digital form by the adder 48; the multiplexed output is converted to an analog signal in the signal conversion part 4X; the analog signal is converted to a transmission signal of the transmission frequency band; and the transmission signal is applied to the power divider 25 in FIG. 24. On the other hand, the pilot signal $PL_{S1}$ from the multiplier 43 is provided to the variable attenuator 52 of the pilot signal cancellation path 150B via the signal conversion part 4X' of the same construction as that of the signal conversion part 4X (FIG. 13). And the transmission signal $S_T$ from the modulator 100 is provided to the variable attenuator 72 of the transmission signal cancellation path 70 via the signal conversion part 4X" of the same construction as that of the signal conversion part 4X. Hence, the pilot signal component contained in the signal provided to the power combiner 81 via the main amplifier output signal cancellation path 150A can be cancelled, and the transmission signal component in the signal provided to the power combiner 81 via the path 150A and then to the power combiner 75 can also be cancelled.

Eighth Embodiment

Figure 25:
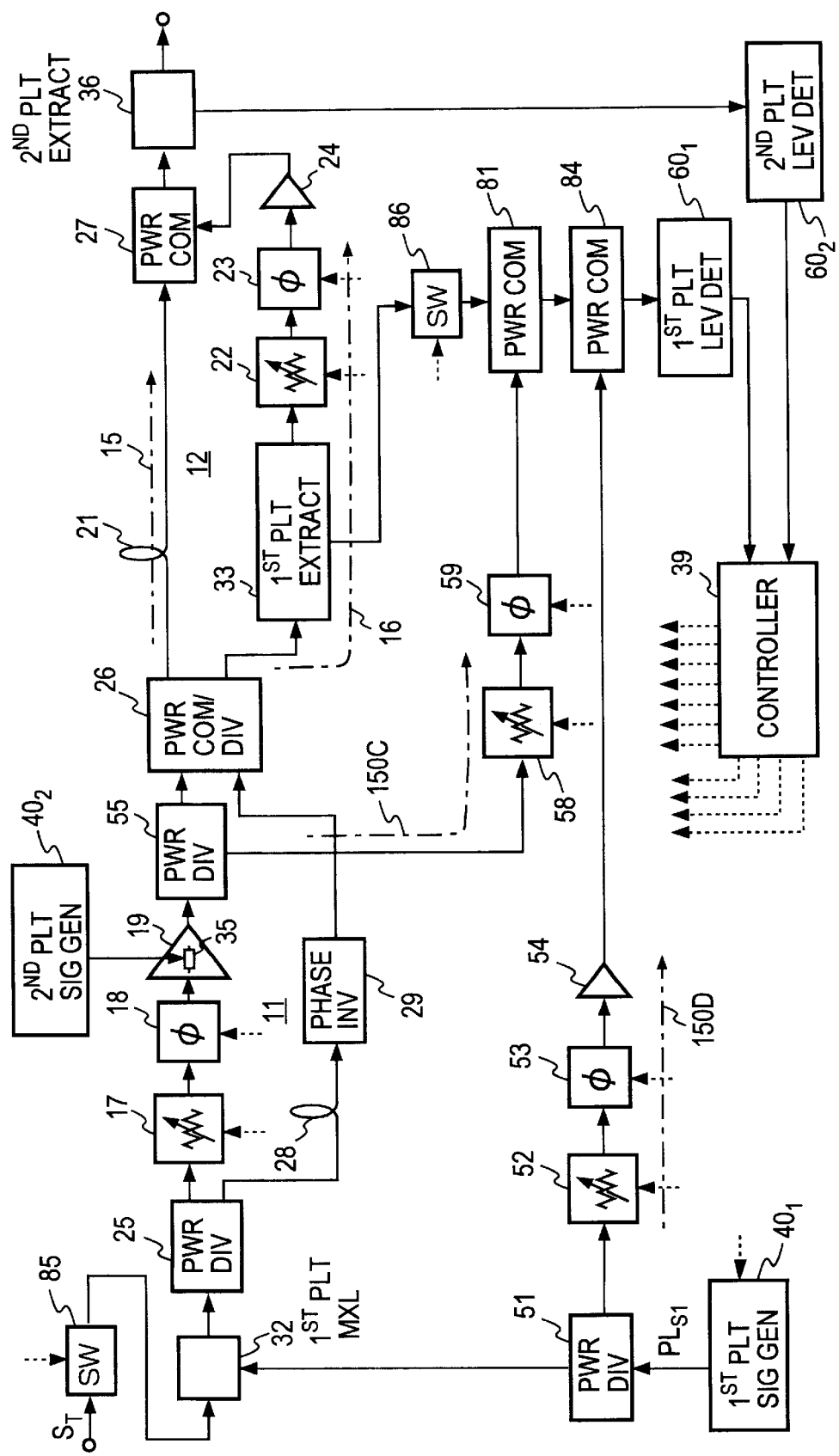
FIG. 25 is a block diagram illustrating the configuration of a feed-forward amplifier according to an eighth embodiment of the present invention.

FIG. 25 illustrates in block form an eighth embodiment of the present invention in which an amplifier output signal cancellation path 150C and a pilot signal injection path 150D are added to the feed-forward amplifier of the first embodiment depicted in FIG. 3. The amplifier output signal cancellation path 150C is made up of a power divider 55, a variable attenuator 58, a variable phase shifter 59 and a power combiner 81. That is, the output from the main amplifier 19 is branched by the power divider 55 to the power divider 26 and the variable attenuator 58. The output from the variable attenuator 58 is provided via the variable phase shifter 59 to the power combiner 81, wherein it is combined with the extracted output fed thereto via a switch 86 from a power combiner that is the first pilot signal extractor 33.

Figure 26:
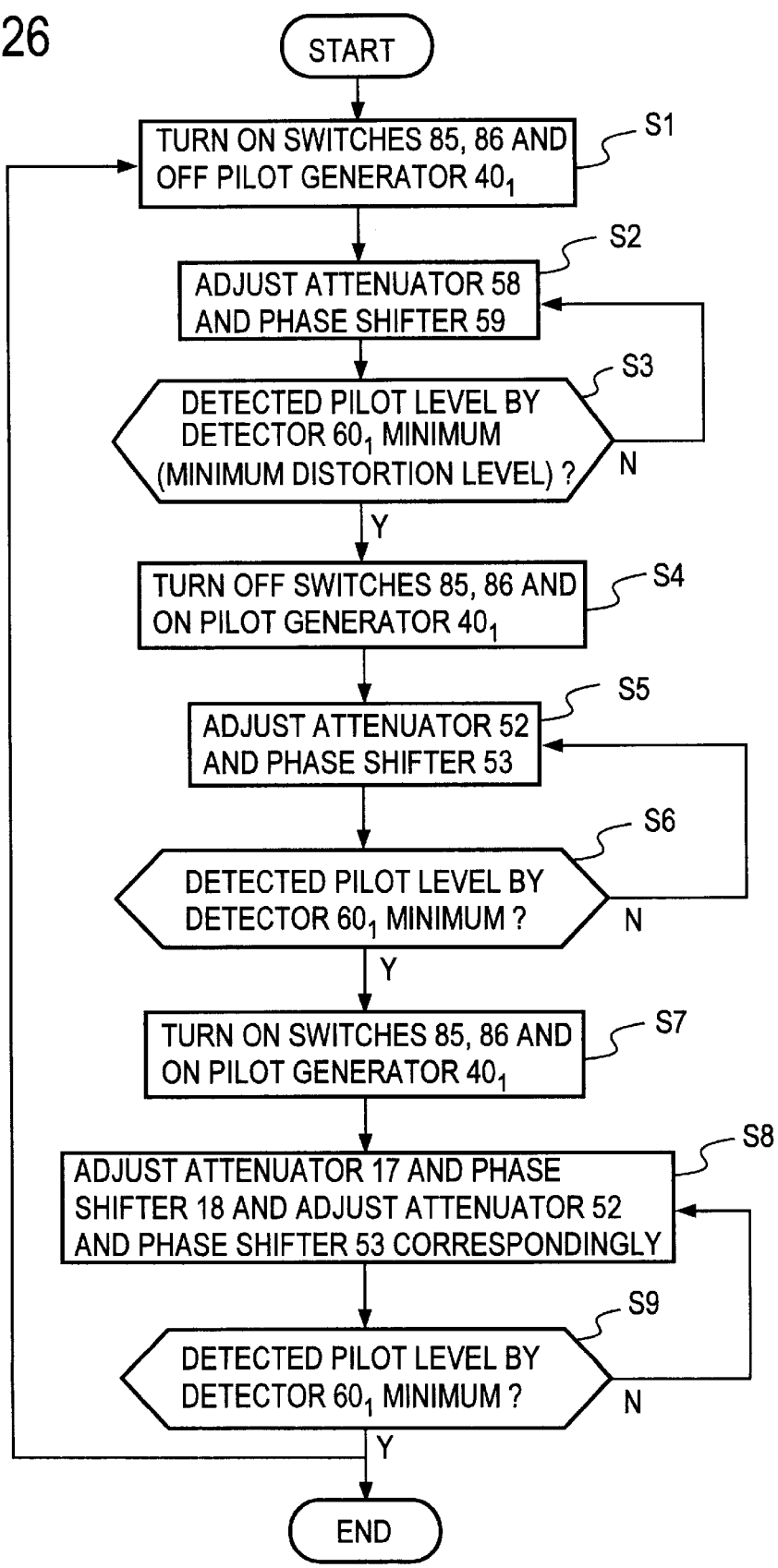
FIG. 26 is a flowchart showing a balance adjustment procedure in the amplifier of FIG. 25.

The pilot signal injection path 150D is made up of a power divider 51, a variable attenuator 52, a variable phase shifter 53, an auxiliary amplifier 54 and a power combiner 84. That is, the pilot signal from the first pilot signal generator $40_1$ is branched by the power divider 51 to the first pilot multiplexer 32 and the variable attenuator 52. The output from the variable attenuator 52 is fed via the variable phase shifter 53 and the auxiliary amplifier 54 to the power combiner 84, wherein it is combined with the output from the power combiner 81. The output from the power combiner 84 is fed to the first pilot level detector $60_1$. The output from the first pilot level detector $60_1$ is used to control the variable attenuators 17, 58, 52 and the variable phase shifters 18, 59, 53 by the controller 39. Connected in series to the input side of the first pilot muliplexer 32 is a switch 85. Turning next to FIG. 26, the operation of this embodiment will be described.

FIG. 26 is a basic flowchart of an algorithm that is used to drive a microprocessor (not shown) in the controller 39 in FIG. 26 to control the variable attenuators 17, 158, 52, the variable phase shifts 18, 59, 53, the switches 85, 86 and the first pilot signal generator $40_1$.

This flowchart consists of four stages. The first stage is to control the variable attenuator 58 and the variable phase shifter 59 step by step to minimize the level detected by the first pilot level detector $60_1$ (S2, S3) when the switches 85 and 86 are turned ON and the first pilot signal generator $40_1$ is turned OFF (S1). This control can be effected using an adaptive control algorithm such as the perturbation, steepest descent or least square estimation method. The variable attenuator 58 and the variable phase shifter 59 are controlled by the controller 39 with the output from the first pilot level detector $60_1$ so that the input signal to the power combiner 81 from the variable phase shifter 59 becomes equal in amplitude and in delay but opposite in phase to the input signal fed to the power combiner 81 from the output of the switch 86. The signal components present in the distortion injection path 16 are a suppressed transmission signal component and a distortion component (not suppressed) generated by the main amplifier 19, but the transmission signal component can essentially be ignored. On the other hand, signal components on the amplifier output signal cancellation path 150C are an unsuppressed transmission signal component and the distortion component (not suppressed) generated by the main amplifier 19. Accordingly, the distortion component by the main amplifier 19 can be removed from the signal component extracted by the first pilot signal extractor 33. The remaining signal component is the transmission signal component.

In the second stage, the switches 85 and 86 are turned OFF and the first pilot signal generator $40_1$ ON (S4), and the variable attenuator 52 and the variable phase shifter 53 are controlled step by step as in the first stage in such a manner as to minimize the level detected by the first pilot level detector $60_1$ (S5, S6). A signal path from the first pilot signal generator $40_1$ to the power combiner 81 via the main amplifier 19, the power divider 55, the variable attenuator 58, the variable phase shifter 59 and the power combiner 59 will hereinafter be referred to as a pilot-signal first path. And the pilot signal injection path 150D from the first pilot signal generator $40_1$ to the power combiner 84 via the variable attenuator 52, the variable phase shifter 53 and the auxiliary amplifier 54 will hereinafter be referred to as a pilot-signal second path. The variable attenuator 52 and the variable phase shifter 53 are controlled by the controller 39 so that the output from the pilot-signal first path (the output from the auxiliary amplifier 54) and the output from the power combiner 81 become equal in amplitude and in delay but opposite in phase to each other to minimize the output from the first pilot level detector $60_1$, thereby permitting substantial cancellation of the first pilot signal component that is fed to the power combiner 81 via the amplifier output signal cancellation path 150C.

In the third stage, the switches 85 and 86 and the first pilot signal generator $40_1$ are turned ON (S7), then the first pilot signal is detected by the first pilot level detector $60_1$, and the variable attenuator 17 and the variable phase shifter 18 are controlled in such a manner as to minimize the level of the first pilot signal (S8, S9). Since the optimum values previously set in the variable attenuators 52, 58 and the variable phase shifters 53, 59 are displaced by the adjustment of the variable attenuator 17 and the variable phase shifter 18, it is necessary to control the variable attenuators 52, 58 and the variable phase shifters 53, 59 in association with the adjustment of the variable attenuator 17 and the variable phase shifter 18. This can be done, for example, by making the same adjustments to the variable attenuators 52, 58 and the variable phase shifters 53, 59 as those to the variable attenuator 17 and the variable phase shifter 18. As a result, only the suppressed transmission signal and the first pilot signal component extracted by the first pilot signal extractor 33 can be detected by the first pilot signal level detector $60_1$. This means that the input signal component to the level detector 82 is a signal equivalent to the distortion detected output—this permits detection of the pilot signal buried in the distortion component and extraction of the pilot signal of the transmission frequency band that is cancelled conventionally.

The fourth stage is to repeat the first to third stages as required, thereby providing increased stability of the accuracy in the detection of the first pilot signal.

In any of the above control schemes, the output level of the first pilot level detectors $60_1$ is controlled to be minimum, but it need not be minimized but may also be close to the minimum value when predetermined electric performance can be achieved.

Ninth Embodiment

Figure 27:
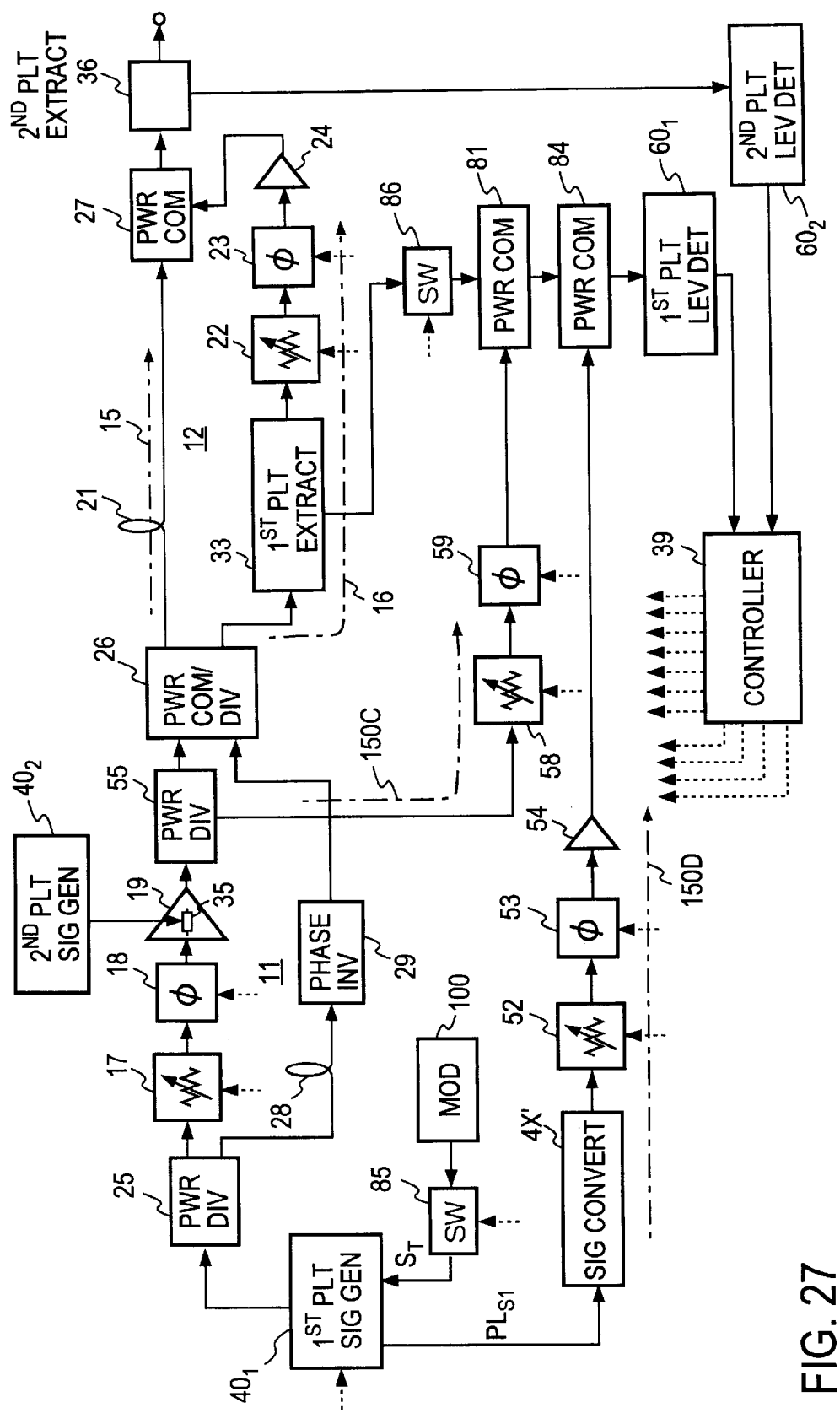
FIG. 27 is a block diagram illustrating the configuration of a feed-forward amplifier according to a ninth embodiment of the present invention.

FIG. 27 illustrates in block form a ninth embodiment of the present invention in which the first pilot signal generator $40_1$ shown in FIG. 13 is used in the FIG. 25 embodiment. As described previously with respect to FIG. 13, the transmission signal $S_T$ and the first pilot signal $PL_{S1}$ are multiplexed in digital form by the adder 48; the multiplexed output is converted to an analog signal in the signal conversion part 4X; the analog signal is converted to a transmission signal of the transmission frequency band; and the transmission signal is applied to the power divider 25 in FIG. 27. On the other hand, the pilot signal $PL_{S1}$ spread by the multiplier 43 is also provided to the signal conversion part 4X' of the same construction as that of the signal conversion part 4X, wherein it is similarly converted to a signal of the transmission frequency band, which is applied to the variable attenuator 52 of the pilot signal cancellation path 150D. This pilot signal $PL_{S1}$ is provided via the variable phase shifter 53 and the auxiliary amplifier 54 to the power combiner 84, wherein it is used to cancel the pilot signal component contained in the signal fed to the power combiner 84 via the main amplifier output signal cancellation path 150C and the power combiner 81. The operations and control of the other parts of this embodiment are the same as described previously with reference to FIGS. 25 and 26. Accordingly, in the FIG. 27 embodiment in which the transmission signal and the pilot signal are multiplexed in digital form, too, it is possible to cancel the pilot signal in the amplifier output signal cancellation path 150A.

Tenth Embodiment

Figure 28:
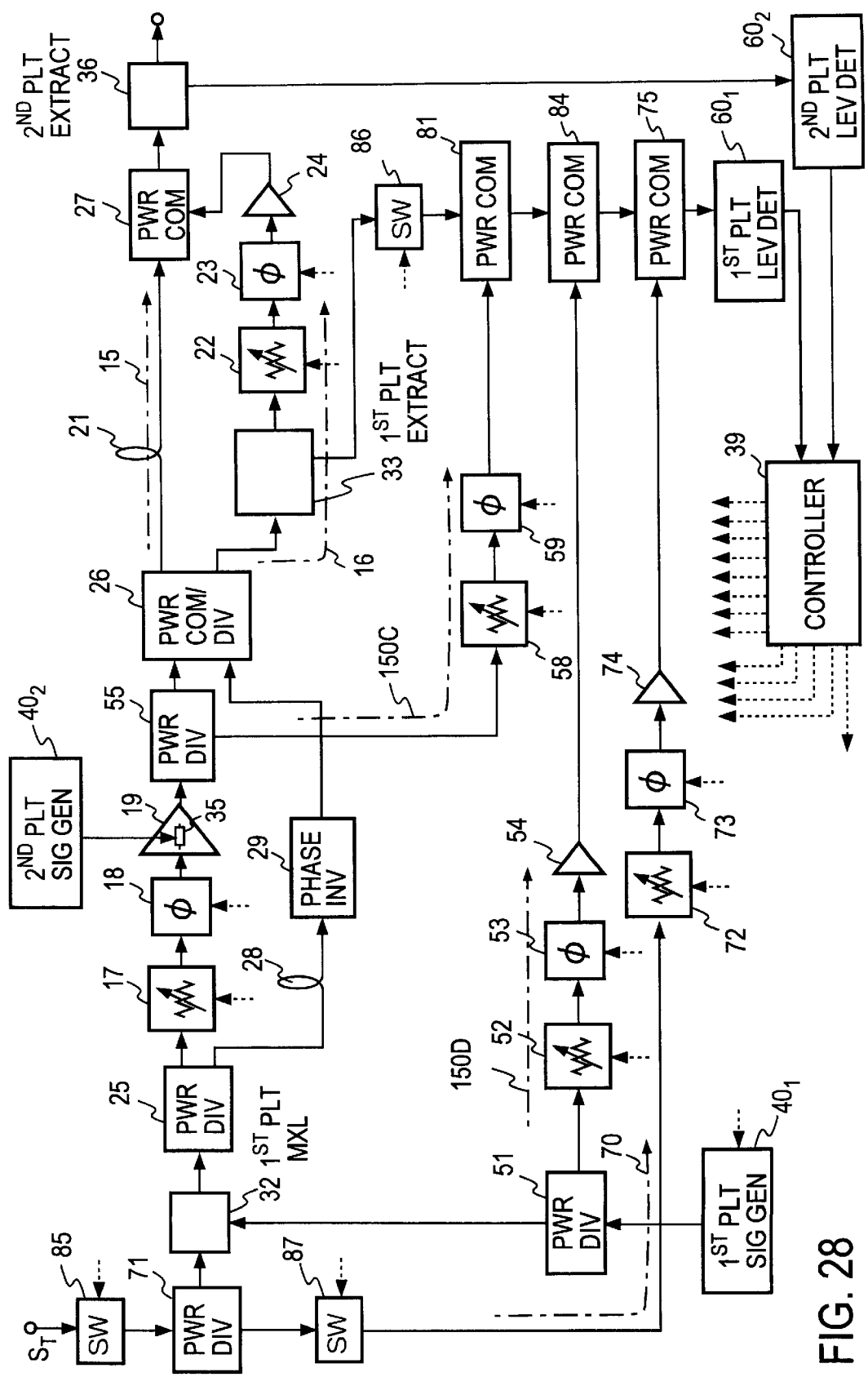
FIG. 28 is a block diagram illustrating the configuration of a feed-forward amplifier according to a tenth embodiment of the present invention.

FIG. 28 illustrates in block form a tenth embodiment of the present invention in which the same transmission signal cancellation path 70 as depicted in FIG. 20 is added to the FIG. 25 embodiment. In the transmission signal cancellation path 70 the power divider 71 connected to the input of the pilot multiplexer 32 branches its input to the pilot mutiplexer 32 and a switch 87. The output of the switch 87 is provided via the variable attenuator 72, the variable phase shifter 73 and the auxiliary amplifier 74 to the power combiner 75, wherein it is combined with the output from the power combiner 84, and the combined output is applied to the first pilot level detector $60_1$. The controller 39 controls the switch 87, the variable attenuator 72 and the variable phase shifter 73 as well as those controlled in the FIG. 24 embodiment. The control operation of the controller 39 will be described below with reference to the flowchart shown in FIG. 29.

The control procedure of FIG. 29 contains, after the second stage (steps S4, S5, S6) in FIG. 26, the following steps S10, S11 and S12 as the third stage, followed by a fourth stage that is the third stage (steps S7, S8, S9) shown in FIG. 26.

In the third stage the switches 85, 86 and 87 are turned ON and the first pilot signal generator $40_1$ is turned OFF (S10), and the variable attenuator 72 and the variable phase shifter 73 are controlled (S11, S12) in such a manner as to minimize the output from the first pilot level detector $60_1$. By this, the variable attenuator 72 and the variable phase shifter 73 are adjusted so that the transmission signal provided via the transmission signal cancellation path 70 to the power combiner 75 and the transmission signal component in the signal extracted by the first pilot signal extractor 33 and provided via the switch 86 and the power combiner 81 and 84 become equal in amplitude and in delay but opposite in phase to each other in the power combiner 75. In consequence, the transmission signal component left unremoved in the second stage can be cancelled in the power combiner 75. The attenuation of the transmission signal may also be set at the maximum by the variable attenuator 72 instead of turning OFF the switch 87. In other words, the variable attenuator 72 can be used also as a substitute for the switch 87.

In the fourth stage the switches 85, 86 and 87 and the first pilot signal generator 401 are turned ON (S7), and the variable attenuator 17 and the variable phase shifter 18 are controlled (S8, S9) in such a manner as to minimize the output from the first pilot level detector $60_1$. This control operation causes displacements of the pre-adjusted optimum values of the variable attenuators 52, 72 and the variable phase shifters 53, 73, but this problem can be solved, as is the case with FIG. 26, by making the same adjustments to them as those to the variable attenuator 17 and the variable phase shifter 18.

In any of the above control schemes, the output level of the first pilot level detectors $60_1$ is controlled to be minimum, but it need not be minimized but may also be close to the minimum value when predetermined electric performance can be achieved.

Eleventh Embodiment

Figure 30:
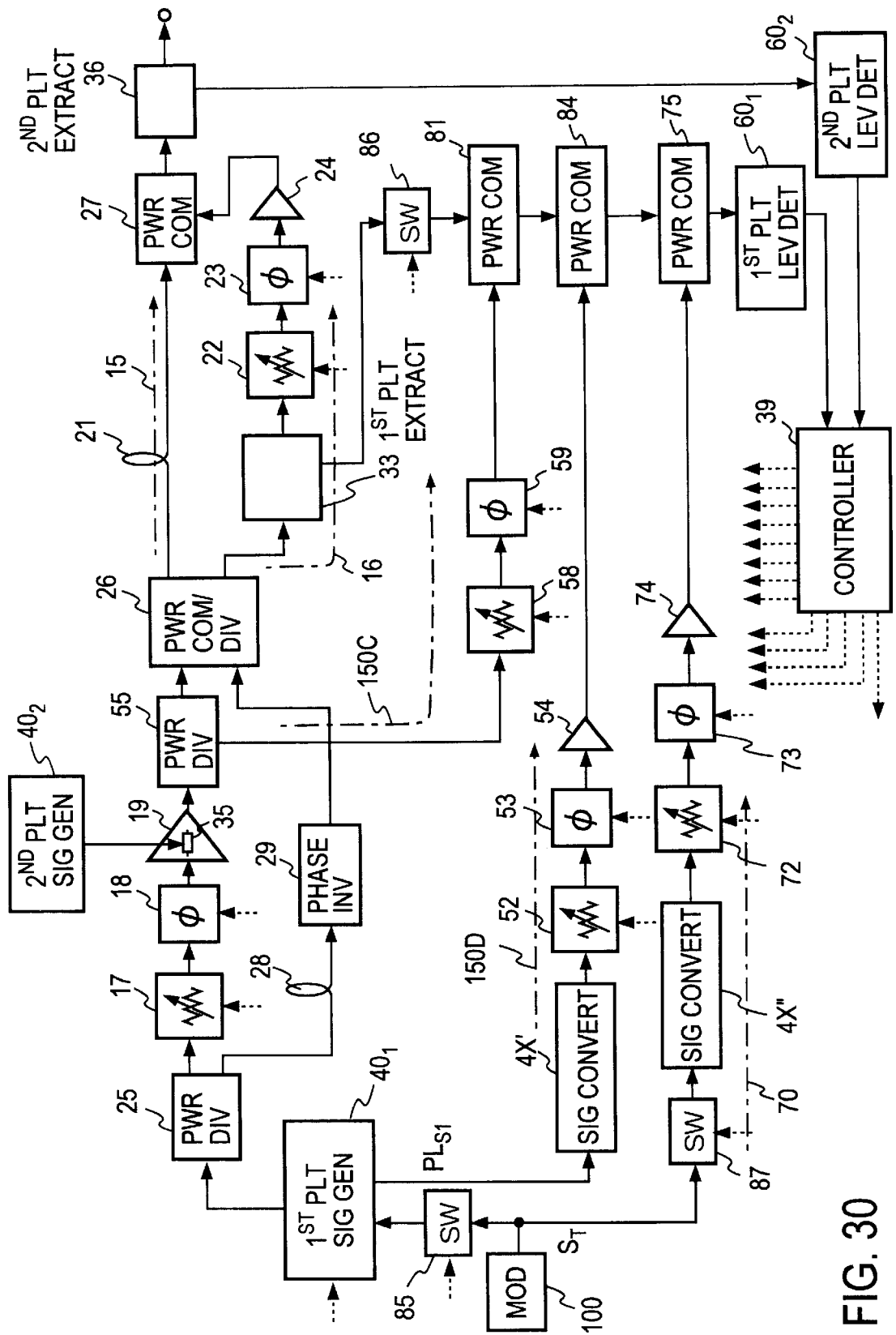
FIG. 30 is a block diagram illustrating the configuration of a feed-forward amplifier according to an eleventh embodiment of the present invention.

FIG. 30 illustrates in block form an eleventh embodiment of the present invention in which the pilot signal generator $40_1$ shown in FIG. 13 is applied to the FIG. 28 embodiment. The illustrated configuration is equivalent to a configuration in which the transmission signal cancellation path 40 containing the signal conversion part 4X" shown in FIG. 16 is added to the FIG. 27 embodiment via a switch 87. As described previously with respect to FIG. 13, the transmission signal $S_T$ and the first pilot signal $PL_{S1}$ are multiplexed in digital form by the adder 48; the multiplexed output is converted to an analog signal in the signal conversion part 4X; the analog signal is converted to a transmission signal of the transmission frequency band; and the transmission signal is applied to the power divider 25 in FIG. 30. On the other hand, the pilot signal $PL_{S1}$ from the multiplier 43 is provided via the signal conversion part 4X' to the variable attenuator 52 of the pilot signal cancellation path 150D, and the transmission signal ST from the modulator 100 is provided via the switch 87 and the signal conversion part 4X" to the variable attenuator 72 of the transmission signal cancellation path 70. Accordingly, the pilot signal component in the signal provided to the power combiner 81 via the main amplifier output signal cancellation path 150C can be cancelled, and the transmission signal component in the signal provided via the path 150C to the power combiner 81 and thence to the power combiner 75 can be cancelled.

Effect Of The Invention

The main points of the present invention may be summarized as follows:

A feed-forward amplifier can be implemented which can be used as a multi-carrier transmitting amplifier for the CDMA-based mobile communication system. The pilot signal does not interfere with the transmission signal. The distortion component superimposed on the pilot signal can also be cancelled, and the pilot signal can be detected by dispreading it. Hence, the setting of the optimum operating point for distortion compensation in the feed-forward amplifier and the automatic adjustment for highly stable amplifying operation can be performed with high accuracy and with high reliability.

(1) The automatic adjustment of distortion compensation in the feed-forward amplifier can be made with high accuracy and with high reliability.

(2) Since the spreading code adopted in the CDMA radio communication system is used for the pilot signal, the transmission signal and the pilot signal can be held orthogonal to each other and the transmission signal is not subject to unnecessary interference.

(3) Since each area uses the spreading code assigned to a different area, no influence is exerted on the code assignment in the radio communication system.

(4) Even if distortions by the main amplifier are superimposed on the pilot signal and interfere therewith, the distortions are sufficiently suppressed at the output side of the second power combiner and the pilot signal can be extracted without being affected by the pilot signal—this permits high-sensitivity, high-stability compensation for distortion.

It will be apparent that many modifications and variations may be effected without departing from the scope of the novel concepts of the present invention.

What is claimed is:

1. A feed-forward amplifier for amplifying a code division multiple access signal, comprising:

a distortion detector which includes a main amplifier for amplifying a signal fed thereto from an input path and detects a nonlinear distortion component of said main amplifier;

a distortion canceller which includes an auxiliary amplifier for amplifying the distortion component detected by said distortion detector and injects said amplified distortion component again into the output of said main amplifier, thereby canceling said distortion component;

first pilot signal generating means for generating a first pilot signal;

second pilot signal generating means for generating a second pilot signal;

multiplexing means provided in said input path, for multiplexing said first pilot signal onto an input transmission signal and for providing the multiplexed signal to said distortion detector;

first variable attenuating means and first phase shifting means inserted in said distortion detector;

second pilot injecting means provided in the path of said main amplifier of said distortion detector, for injecting said second pilot signal;

second variable attenuating means and second variable phase shifting means inserted in said distortion canceller;

first level detecting means inserted in the path of said auxiliary amplifier of said distortion cancellor, for detecting the level of said first pilot signal;

second level detecting means inserted in the output path of said distortion canceller, for detecting the level of said second pilot signal; and control means for controlling said first variable attenuating means and said first variable phase shifting means in a manner to minimize the detection level of said first level detecting means, and for controlling said second variable attenuating means and said second phase shifting means in a manner to minimize the detection level of said second level detecting means;

wherein said first pilot signal generating means comprises:

code generating means for generating a first pilot code of a predetermined code pattern;

spreading means for spreading said first pilot code by a spreading code in a radio communication system of said code division multiple access;

first signal converting means for converting the output of said spreading means to a signal of a predetermined frequency band to be amplified by said feed-forward amplifier, thereby generating said first pilot signal; and wherein said first level detecting means comprises:

second signal converting means for frequency converting said predetermined frequency band amplified by said auxiliary amplifier to the base band;

despreading means for spectrum-despreading the output of said second signal converting means by said spreading code; and code detecting means for detecting the level of said first pilot code from the output of said despreading means.

2. The feed-forward amplifier of claim 1, which further comprises:

power dividing means inserted in said input path of said distortion detector at the input side of said multiplexing means, for dividing a transmission signal to two transmission signals, and for supplying one of said two transmission signal to said distortion detector;

a series circuit of third variable attenuating means, third variable phase shifting means and a second auxiliary amplifying means which is supplied with the other of said two transmission signals divided by said power dividing means; and power combining means for combining the output of said second pilot signal extracting means and the output of said series circuit, and for providing the combined output to said second level detecting means; and wherein said control means: controls said third variable attenuating means and said third variable phase shifting means in a manner to minimize the detection level of said second level detecting means; controls said first variable attenuating means and said first variable phase shifting means in a manner to minimize the detection level of said first level detecting means; and controls said second variable attenuating means and said second variable phase shifting means in a manner to minimize the detection level of said second level detecting means.

3. The feed-forward amplifier of claim 1, which further comprises:

first power dividing means for dividing said first pilot signal into two first pilot signals, and for applying one of said two first pilot signals to said multiplexing means;

a first series circuit of third variable attenuating means, third variable phase shifting means and second auxiliary amplifying means into which the other of said two first pilot signals divided by said first power dividing means is input;

second power dividing means for dividing the output of said main amplifier into two outputs, and for providing one of said two outputs to said distortion canceller;

first power combining means for combining the other of said two outputs from said second power dividing means and the output of said first series circuit;

a second series circuit of fourth variable attenuating means and fourth variable phase shifting means;

third power dividing means for dividing the output of said first power combining means to two outputs, and for providing one of said two outputs to said second series circuit;

third level detecting means supplied with the other of said two outputs from said third power dividing means, for detecting the level of said other output, and for providing the detected level to said control means; and second power combining means for combining the output of said second series circuit and the output of said first pilot extracting means, and for providing the combined output to said first level detecting means; and wherein said control means: controls said third variable attenuating means and said third variable phase shifting means in a manner to minimize the detection level of said third level detecting means; controls said fourth variable attenuating means and said fourth variable phase shifting means in a manner to minimize the detection level of said first level detecting means; and controls said second variable attenuating means and said second variable phase shifting means in a manner to minimize the detection level of said second level detecting means.

4. The feed-forward amplifier of claim 3, which further comprises:

fourth power dividing means provided in said input path at the input side of said multiplexing means, for dividing a transmission signal to two transmission signals, and for providing one of said two transmission signals to said multiplexing means;

a third series circuit of fifth variable attenuating means, fifth variable phase shifting means and third auxiliary amplifying means which is supplied with the other of said two transmission signals divided by said fourth power dividing means; and third power combining means for combining the output of said second power combining means and the output of said third series circuit, and for providing the combined output to said first level detecting means; and wherein said control means:
controls said fourth variable attenuating means and said fourth variable phase shifting means in a manner to minimize the detection level of said third level detecting means; controls said fifth variable attenuating means and said fifth variable phase shifting means in a manner to minimize the detection level of said first level detecting means; controls said first variable attenuating means and said first variable phase shifting means in a manner to minimize the detection level of said first level detecting means; controls said second variable attenuating means and said second variable phase shifting means in a manner to minimize the detection level of said second level detecting means; and controls said third variable attenuating means and said third variable phase shifting means in a manner to minimize the detection level of said first level detecting means.

5. The feed-forward amplifier of claim 1, which further comprises:
a first switch provided in said input path at the input side of said multiplexing means, for turning ON and OFF a transmission signal;
first power dividing means for dividing said first pilot signal to two first pilot signals, and for applying one of said two first pilot signals to said multiplexing means;
second power dividing means for dividing the output of said main amplifier to two outputs, and for applying one of said two outputs to said distortion canceller;
a first series circuit of third variable attenuating means and third variable phase shifting means which is supplied with the other of said two outputs of said second power dividing means;
a second series circuit of fourth variable attenuating means, fourth variable phase shifting means and second auxiliary amplifying means which is supplied with the other of said two first pilot signals divided by said first power dividing means;
a second switch for turning ON and OFF a signal extracted at the output of said first pilot extracting means;
first power combining means for combining the output of said first power combining means and the output of said second series circuit; and
second power combining means for combining the output of said first power combining means and the output of said second series circuit, and for applying the combined output to said first level detecting means; and wherein said control means:
turns OFF the output of said first pilot signal generating means and ON said first and second switches, and controls said third variable attenuating means and said third variable phase shifting means in a manner to minimize the detection level of said first level detecting means;
turns ON the output of said first pilot signal generating means and OFF said first and second switches, and controls said fourth variable attenuating means and said fourth variable phase shifting means in a manner to minimize the detection level of said first level detecting means;
turns ON the output of said first pilot signal generating means and ON said first and second switches, and controls said first variable attenuating means and said first phase shifting means in a manner to minimize the detection level of said first level detecting means, and shifts the controlled variable of said first variable attenuating means from a set value of said fourth variable attenuating means and the controlled variable of said first variable phase shifting means from a set value of said fourth variable phase shifting means; and
controls said second variable attenuating means and said variable second phase shifting means in a manner to minimize the detection level of said second level detecting means.

6. The feed-forward amplifier of claim 5, which further comprises:
third power combining means inserted between said first switch and said multiplexing means in said input path, for dividing a transmission signal to two transmission signals, and for applying one of said two transmission signals to said multiplexing means;
a third switch supplied with the other of said two transmission signals divided by said third power dividing means;
a third series circuit of fifth variable attenuating means, fifth variable phase shifting means and third auxiliary amplifying means which is supplied with the output of said third switch; and
third power combining means for combining the output of said second power combining means and the output of said third series circuit, and for applying the combined output to said first level detecting means; and wherein said control means:
turns OFF said first pilot signal generating means, ON said first and second switches and OFF said third switch, and controls said third variable attenuating means and said third variable phase shifting means in a manner to minimize the detection level of said first level detecting means;
turns ON said first pilot signal generating means, OFF said first and second switches and OFF said third switch, and controls said fourth variable attenuating means and said fourth variable phase shifting means in a manner to minimize the detection level of said first level detecting means;
turns ON said first pilot signal generating means, ON said first and second switches and OFF said third switch, and controls said first variable attenuating means and said first variable phase shifting means in a manner to minimize the detection level of said first level detecting means;
shifts the controlled variable of said first variable attenuating means from a set value of said fourth variable attenuating means, and shifts the controlled variable of said first variable phase shifting means from a set value of said fourth variable phase shifting means;
turns ON said first pilot signal generating means, ON said first and second switches and ON said third switch, and controls said fifth variable attenuating means and said fifth variable phase shifting means in a manner to minimize the detection level of said first level detecting means; and
controls said second variable attenuating means and said second variable phase shifting means in a manner to minimize the detection level of said second level detecting means.

7. A feed-forward amplifier for amplifying a code division multiple access signal, comprising:
- a distortion detector which includes a main amplifier for amplifying a signal fed thereto from an input path and detects a nonlinear distortion component of said main amplifier;
- a distortion canceller which includes an auxiliary amplifier for amplifying the distortion component detected by said distortion detector and injects said amplified distortion component again into the output of said main amplifier, thereby canceling said distortion component;
- first pilot signal generating means for generating a multiplexed signal of a transmission signal and a first pilot signal, and for applying said multiplexed signal to said distortion detector via said input path;
- second pilot signal generating means for generating a second pilot signal;
- first variable attenuating means and first variable phase shifting means inserted in said distortion detector;
- pilot injecting means provided in the path of said main amplifier of said distortion detector, for injecting said second pilot signal;
- second variable attenuating means and second variable phase shifting means inserted in said distortion canceller;
- first level detecting means inserted in the path of said auxiliary amplifier of said distortion cancellor, for detecting the level of said first pilot signal;
- second level detecting means inserted in the output path of said distortion canceller, for detecting the level of said second pilot signal; and
- control means for controlling said first variable attenuating means and said first variable phase shifting means in a manner to minimize the detection level of said first level detecting means, and for controlling said second variable attenuating means and said second phase shifting means in a manner to minimize the detection level of said second level detecting means;
- wherein said first pilot signal generating means comprises:
  - code generating means for generating a first pilot code of a predetermined code pattern;
  - spreading means for spreading said first pilot code by a spreading code in a radio communication system of said code division multiple access to generate a base-band first pilot signal;
  - multiplexing means for multiplexing said base-band first pilot signal from said spreading means onto a base-band transmission signal; and
  - first signal converting means for converting the output of said multiplexing means to a signal of a predetermined frequency band to be amplified by said feed-forward amplifier, thereby generating said first pilot signal multiplexed onto said transmission signal; and
- wherein said first level detecting means comprises:
  - second signal converting means for converting a signal of said predetermined frequency band amplified by said auxiliary amplifier to a base band signal;
  - despreading means for spectrum-despreading the output of said second signal converting means by said spreading code; and
  - code detecting means for detecting the level of said first pilot code from the output of said despreading means.

8. The feed-forward amplifier of claim 7, which further comprises:
- third signal converting means supplied with said base band transmission signal, for converting it to a transmission signal of said predetermined frequency band;
- a series circuit of third variable attenuating means, third variable phase shifting means and second auxiliary amplifying means which is supplied with the output of said third signal converting means; and
- power combining means for combining the output of said second pilot signal extracting means and the output of said series circuit, and for applying the combined output to said second level detecting means; and
- wherein said control means: controls said first variable attenuating means and said variable phase shifting means in a manner to minimize the detection level of said first level detecting means; controls said third variable attenuating means and said third variable phase shifting means in a manner to minimize the detection level of said second level detecting means; and controls said second variable attenuating means and said second variable phase shifting means in a manner to minimize the detection level of said second level detecting means.

9. The feed-forward amplifier of claim 7, which further comprises:
- third signal converting means supplied with said base band first pilot signal from said spreading means, for converting it to a signal of said predetermined frequency band;
- a first series circuit of third variable attenuating means, third variable phase shifting means and second auxiliary amplifying means which is supplied with the output of said third signal converting means;
- second power dividing means for dividing the output of said main amplifier to two outputs, for applying one of said two outputs to said distortion canceller;
- first power combining means for combining the other of said two outputs divided by said second power dividing means and the output of said first series circuit;
- a second series circuit of fourth variable attenuating means and fourth variable phase shifting means;
- third power dividing means for dividing the output of said first power combining means to two outputs, and for applying one of said two outputs to said second series circuit;
- third level detecting means supplied with the other of said two outputs divided by said third power dividing means, for detecting the level of said other output and applying the detected output to said control means; and
- second power combining means for combining the output of said second series circuit and the output of said first pilot extracting means; and
- wherein said control means:
  - controls said third variable attenuating means and said third variable phase shifting means in a manner to minimize the detection level of said third level detecting means; controls said fourth variable attenuating means and said fourth variable phase shifting means in a manner to minimize the detection level of said first level detecting means; controls said first variable attenuating means and said first phase shifting means in a manner to minimize the detection level of said first level detecting means; and controls said second variable attenuating means and said second variable phase shifting means in a manner to minimize the detection level of said second level detecting means.

10. The feed-forward amplifier of claim 9, which further comprises:

fourth signal converting means supplied with said base band transmission signal, for converting it to a transmission signal of said predetermined frequency band;

a third series circuit of fifth variable attenuating means and fifth variable phase shifting means which is supplied with said transmission signal from said fourth signal converting means; and third power combining means for combining the output of said second power combining means and the output of said third series circuit, and for applying the combined output to said first level detecting means; and wherein said control means:

controls said third variable attenuating means and said third variable phase shifting means in a manner to minimize the detection level of said third level detecting means; controls said fourth variable attenuating means and said fourth variable phase shifting means in a manner to minimize the detection level of said first level detecting means; controls said fifth variable attenuating means and said fifth phase shifting means in a manner to minimize the detection level of said first level detecting means; controls said first variable attenuating means and said first variable phase shifting means in a manner to minimize the detection level of said first level detecting means; shifts setting of said third and fifth variable attenuating means and said third and fifth phase shifting means by the controlled variables of said first variable attenuating means and said first variable phase shifting means; and controls said second variable attenuating means and said second variable phase shifting means in a manner to minimize the detection level of said second level detecting means.

11. The feed-forward amplifier of claim 7, which further comprises:

a first switch for turning ON and OFF said base band transmission signal that is input into said multiplexing means of said first pilot signal generating means;

second power dividing means for dividing the output of said main amplifier to two outputs, and for applying one of said two outputs to said distortion canceller;

a first series circuit of third variable attenuating means and third variable phase shifting means which is supplied with the other of said two outputs divided by said second power dividing means;

a second series circuit of fourth variable attenuating means, fourth variable phase shifting means and second auxiliary amplifying means which is supplied with the output of said spreading means;

a second switch for turning ON and OFF the signal extracted by said first pilot extracting means;

first power combining means for combining the output of said second switch and the output of said first series circuit; and second power combining means for combining the output of said first power combining means and the output of said second series circuit; and wherein said control means:

turns OFF said first pilot signal generating means and ON said first and second switches, and controls said third variable attenuating means and said third variable phase shifting means in a manner to minimize the detection level of said first level detecting means;

turns ON said first pilot signal generating means and OFF said first and second switches, and controls said fourth variable attenuating means and said fourth variable phase shifting means in a manner to minimize the detection level of said first level detecting means;

turns ON said first pilot signal generating means and ON said first and second switches, and controls said first variable attenuating means and said first variable phase shifting means in a manner to minimize the detection level of said first level detecting means;

shifts the controlled variable of said first variable attenuating means from a set value of said fourth variable attenuating means, and shifts the controlled variable of said fist variable phase shifting means from a set value of said fourth variable attenuating means; and controls said second variable attenuating means and said second variable phase shifting means in a manner to minimize the detection level of said second level detecting means.

12. The feed-forward amplifier of claim 11, which further comprises:

a third switch supplied with said base band transmission signal, for turning ON and OFF its passage therethrough;

second signal converting means for converting the output of said third switch to a transmission signal to a transmission signal of said predetermined frequency band;

third series circuit of fifth variable attenuating means, fifth variable phase shifting means and third auxiliary amplifying means which is supplied with said transmission signal from said second signal converting means; and third power combining means for combining the output of said second power combining means and the output of said third series circuit, and for applying the combined output to said first level detecting means; and wherein said control means:

turns OFF said first pilot signal generating means, ON said first and second switches and OFF said third switch, and controls said third variable attenuating means and said third variable phase shifting means;

turns ON said first pilot signal generating means, OFF said first and second switches and OFF said third switch, and controls said fourth variable attenuating means and said fourth variable phase shifting means in a manner to minimize the detection level of said first level detecting means;

turns ON said first pilot signal generating means, ON said first and second switches and OFF said third switch, and controls said first variable attenuating means and said first variable phase shifting means to minimize the detection level of said first level detecting means;

shifts the controlled variable of said first variable attenuating means from a set value of said fourth variable attenuating means, and shifts the controlled variable of said first variable phase shifting means from a set value of said fourth variable phase shifting means;

turns ON said first pilot signal generating means, ON said first and second switches and ON said third switch, and controls said fifth variable attenuating means and said fifth variable phase shifting means in a manner to minimize the detection level of said first level detecting means; and controls said second variable attenuating means and said second variable phase shifting means in a manner to minimize the detection level of said second level detecting means.

13. The feed-forward amplifier of any one of claims 1 through 12, wherein a spreading code different from a spreading code for communication use, assigned to an area where said feed-forward amplifier is placed, is used for spectrum spreading in said spreading means.

14. The feed-forward amplifier of any one of claims 1 through 12, wherein said first pilot signal generating means includes error correcting encoding means for encoding said first pilot code into an error code and for applying it to said spreading means, and said first level detecting means includes an error correcting code decoding means for decoding the output of said despreading means and providing the decoded output to said code detecting means.

15. The feed-forward amplifier of any one of claims 1 through 12, wherein said second pilot signal generating means comprises:

second code generating means for generating a second pilot code of a predetermined second code pattern;

second spreading means for spectrum-spreading said second pilot code by a second spreading code in said code division multiple access radio communication; and second-pilot first signal converting means for converting the output of said second spreading means to a signal of another frequency band to be amplified by said feed-forward amplifier and for providing said converted signal to said pilot injecting means; and said second level detecting means comprises:

second-pilot second signal converting means for converting the extracted output of said second pilot signal extracting means to a base band signal;

second despreading means for spectrum-despreading said base band signal by said spreading code; and second code detecting means for detecting the level of said second pilot code from the output of said second despreading means.

16. The feed-forward amplifier of claim 15, wherein said second pilot signal generating means includes second error correcting encoding means for encoding said second pilot code into an error correcting code and for outputting it to said second spreading means, and said second level detecting means includes decoding means for decoding the output of said second despreading means.

17. The feed-forward amplifier of any one of claims 1 through 12, wherein said distortion detector comprises:

said input path into which a transmission signal is input; a main amplifier signal path with said main amplifier inserted therein; a linear signal path; a power divider for branching said transmission signal to said main amplifier signal path and said linear signal path; said first variable attenuating means and said first variable phase shifting means inserted in said main amplifier signal path; and a power divider/combiner for combining the output of said main amplifier signal path and the output of said linear signal path and for dividing the combined output to two outputs; and said distortion canceller comprises:

a distortion injection path which is supplied with one of said two outputs of said power combiner/divider and has said auxiliary amplifying means inserted therein; a main signal path which is supplied with the other of said two outputs of said power combiner/divider; said output path; said second variable attenuating means and said second variable phase shifting means inserted in said distortion injection path; and a power combiner for combining signals from said main signal path and said distortion injection path and for providing the combined output to said output path.

\* \* \* \* \*